(12) United States Patent
Carney et al.

(10) Patent No.: US 11,393,692 B2
(45) Date of Patent: Jul. 19, 2022

(54) SEMICONDUCTOR PACKAGE ELECTRICAL CONTACT STRUCTURES AND RELATED METHODS

(71) Applicant: SEMICONDUCTOR COMPONENTS INDUSTRIES, LLC, Phoenix, AZ (US)

(72) Inventors: Francis J. Carney, Mesa, AZ (US); Michael J. Seddon, Gilbert, AZ (US); Yusheng Lin, Phoenix, AZ (US); Takashi Noma, Ota (JP); Eiji Kurose, Oizumi-machi (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/861,994

(22) Filed: Apr. 29, 2020

(65) Prior Publication Data
US 2020/0395217 A1  Dec. 17, 2020

Related U.S. Application Data

(60) Continuation-in-part of application No. 16/702,958, filed on Dec. 4, 2019, which is a division of
(Continued)

(51) Int. Cl.
*H01L 23/00* (2006.01)
*H01L 21/302* (2006.01)
(Continued)

(52) U.S. Cl.
CPC ............ *H01L 21/302* (2013.01); *H01L 21/48* (2013.01); *H01L 21/561* (2013.01);
(Continued)

(58) Field of Classification Search
CPC .................................................. H01L 24/26
See application file for complete search history.

(56) References Cited

U.S. PATENT DOCUMENTS 6,319,796 B1  11/2001  Laparra et al.
7,682,874 B2   3/2010  Xiaochun
(Continued)

FOREIGN PATENT DOCUMENTS

CN  104201114 A  12/2014

OTHER PUBLICATIONS

Extended European Search Report, European Patent Application No. 18184165.1, dated Jan. 17, 2019, 8 pages.
(Continued)

*Primary Examiner* — Christopher A Johnson
(74) *Attorney, Agent, or Firm* — Adam R. Stephenson, Ltd.

(57) ABSTRACT

Implementations of a semiconductor package may include a die; a first pad and a second pad, the first pad and the second pad each including a first layer and a second layer where the second layer may be thicker than the first layer. At least a first conductor may be directly coupled to the second layer of the first pad; at least a second conductor may be directly coupled to the second layer of the second pad; and an organic material may cover at least the first side of the die. The at least first conductor and the at least second conductor extend through openings in the organic material where a spacing between the at least first conductor and the at least second conductor may be wider than a spacing between the second layer of the first pad and the second layer of the second pad.

16 Claims, 23 Drawing Sheets

Related U.S. Application Data application No. 15/679,661, filed on Aug. 17, 2017, now Pat. No. 10,529,576, which is a continuation-in-part of application No. 15/921,898, filed on Mar. 15, 2018, now Pat. No. 10,748,850.

(51) Int. Cl.

| | | |
|---|---|---|
| *H01L 21/56* | (2006.01) | |
| *H01L 23/31* | (2006.01) | |
| *H01L 21/48* | (2006.01) | |
| *H01L 21/78* | (2006.01) | |
| *H01L 23/12* | (2006.01) | |

(52) U.S. Cl.
CPC ............ *H01L 21/565* (2013.01); *H01L 21/78* (2013.01); *H01L 23/12* (2013.01); *H01L 23/3185* (2013.01); *H01L 24/04* (2013.01); *H01L 24/26* (2013.01); *H01L 2224/94* (2013.01)

(56) References Cited

U.S. PATENT DOCUMENTS

| | | |
|---|---|---|
| 7,745,261 B2 | 6/2010 | Xiaochun |
| 8,836,146 B2 | 9/2014 | Chou |
| 9,496,193 B1 | 11/2016 | Roesner et al. |
| 2003/0155641 A1 | 8/2003 | Yeo |
| 2006/0046436 A1 | 3/2006 | Chuchi |
| 2008/0007927 A1* | 1/2008 | Ito ..................... H01L 23/49822 361/764 |
| 2008/0014677 A1 | 1/2008 | Xiaochun et al. |
| 2009/0215227 A1 | 8/2009 | Tan et al. |
| 2010/0109052 A1* | 5/2010 | Nakajima ............... H01L 24/11 257/197 |
| 2011/0175242 A1 | 7/2011 | Grivna et al. |
| 2014/0217556 A1 | 8/2014 | Peh et al. |
| 2016/0225733 A1 | 8/2016 | Wilcoxen |
| 2017/0032981 A1 | 2/2017 | Chinnusamy |
| 2017/0033026 A1 | 2/2017 | Ho et al. |
| 2017/0243846 A1 | 8/2017 | Chen et al. |
| 2018/0033739 A1* | 2/2018 | Seddon ............ H01L 21/02035 |
| 2020/0294926 A1* | 9/2020 | Wu .................... H01L 23/49833 |
| 2020/0303269 A1* | 9/2020 | Okumura ................ H01L 22/32 |

OTHER PUBLICATIONS

Insulating Film Ajinomoto Build-Up Film, Ajinomoto Fine-TechnoCo., Inc., available at https:www.aft-website.com/en/electron/abf. Last vivisted Jul. 14, 2017.

JCAP Sidewall Isolated 0201/01005 DSN, Slide from JCAP, available at least as early as Jun. 22, 2017.

Anonymous, Integration of a Heat Sink (or Slug) and Lead in a Semiconductor Component for Improved thermal, surge and Rdson Characteristics, IP.com No. IPCOM000004597D, Feb. 27, 2001,4 pages.

\* cited by examiner

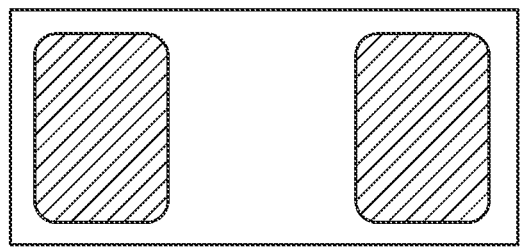
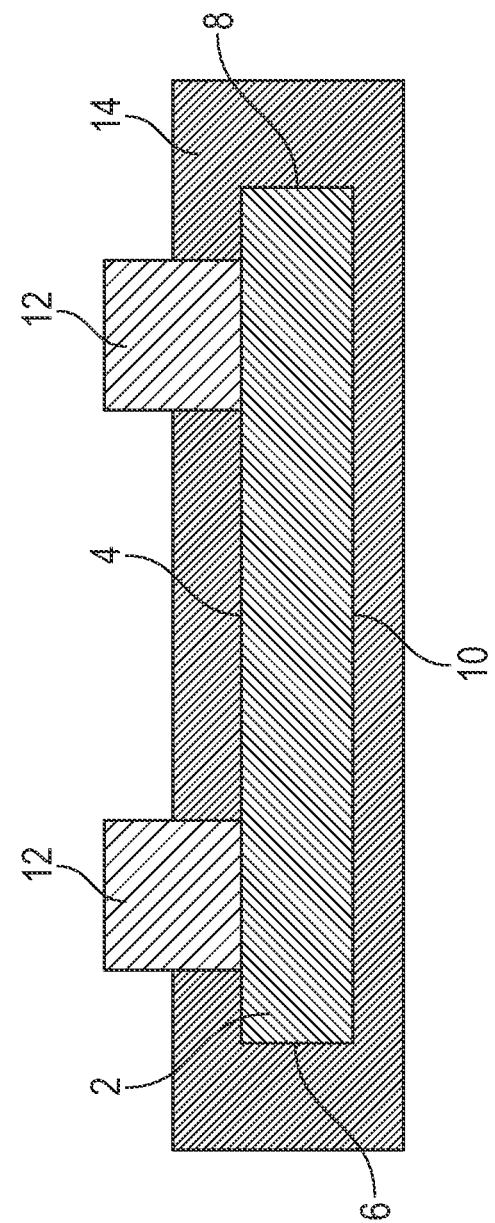

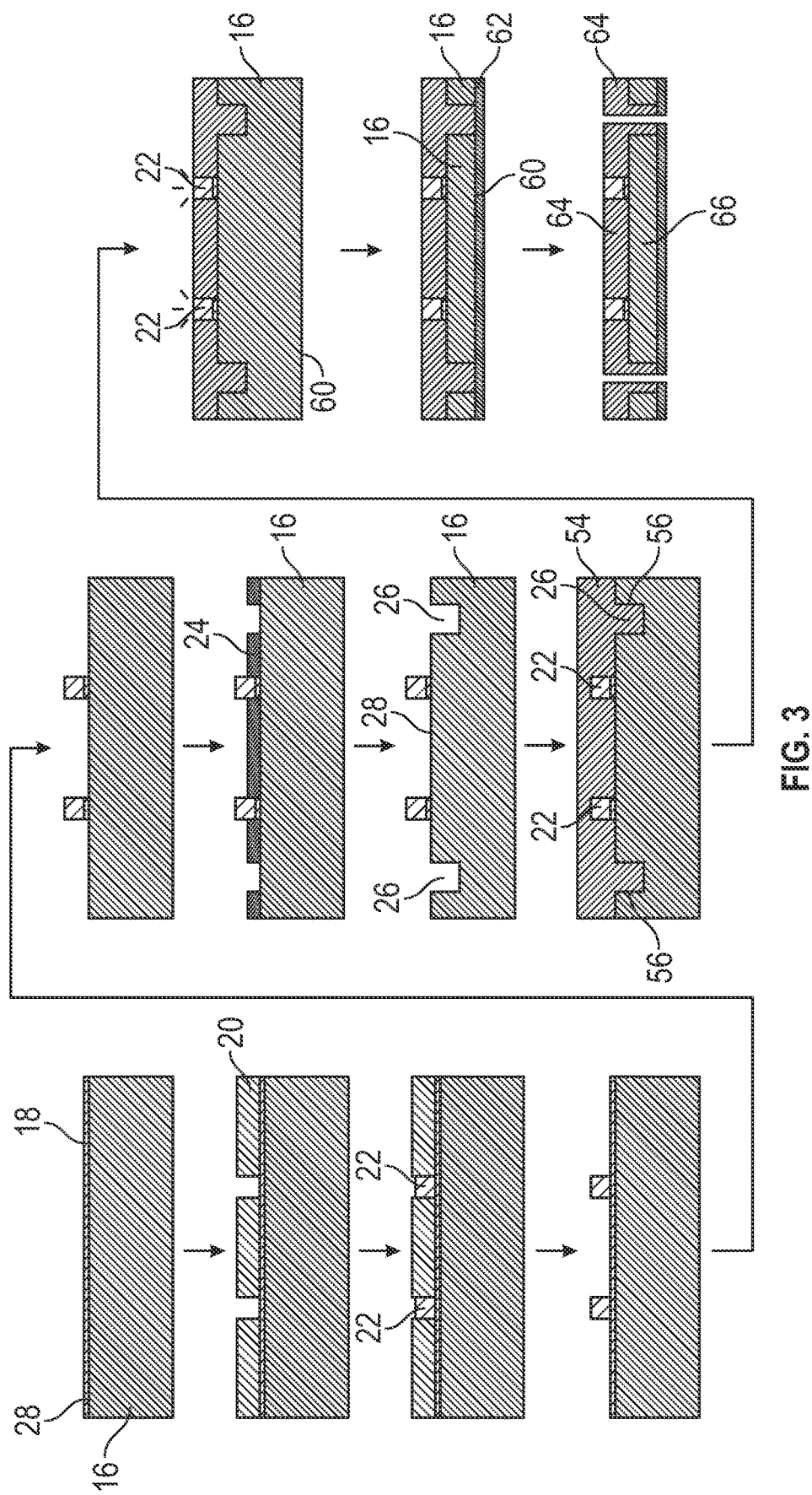

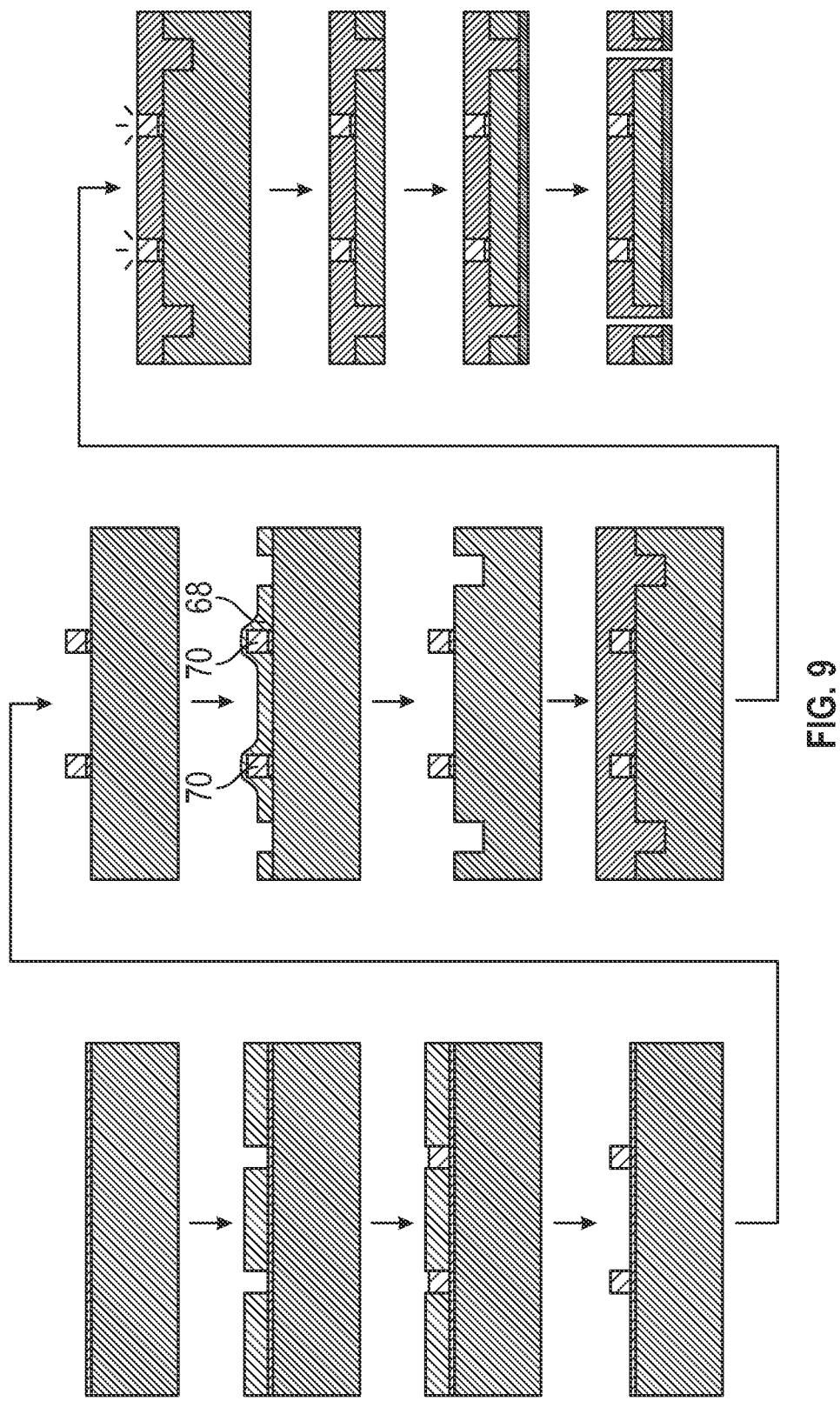

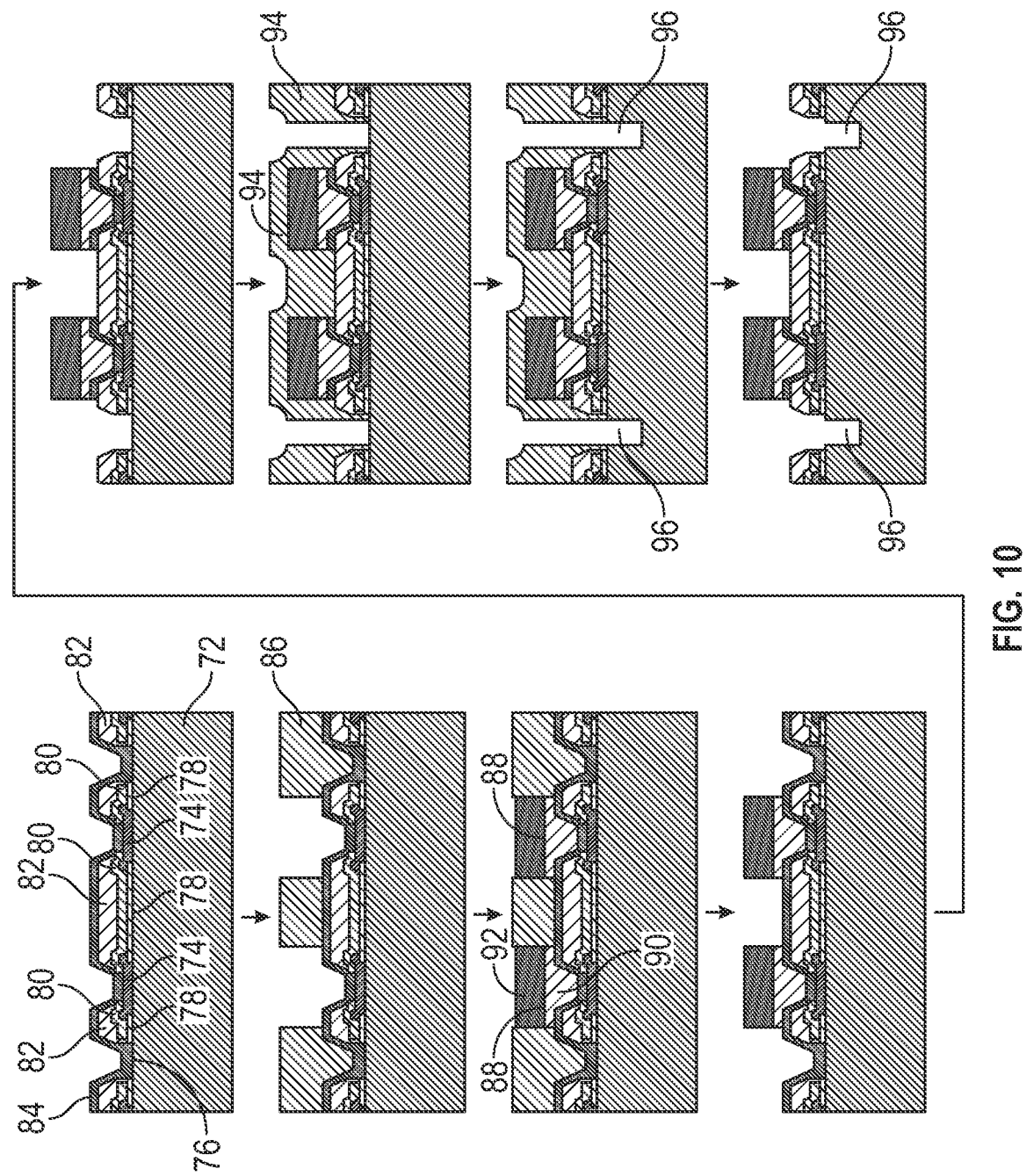

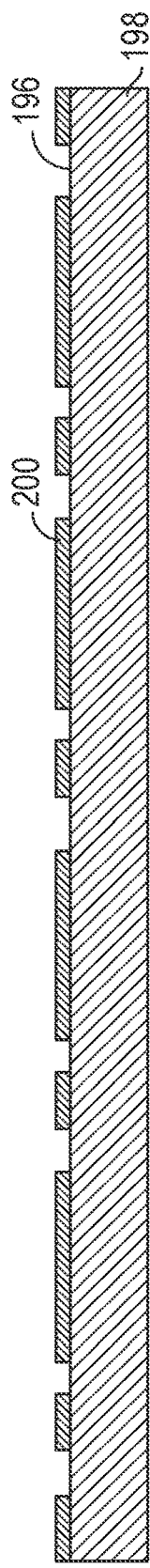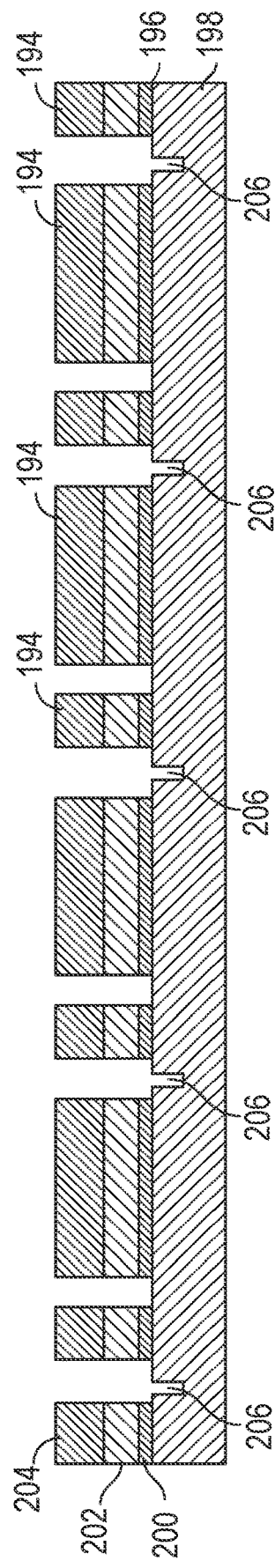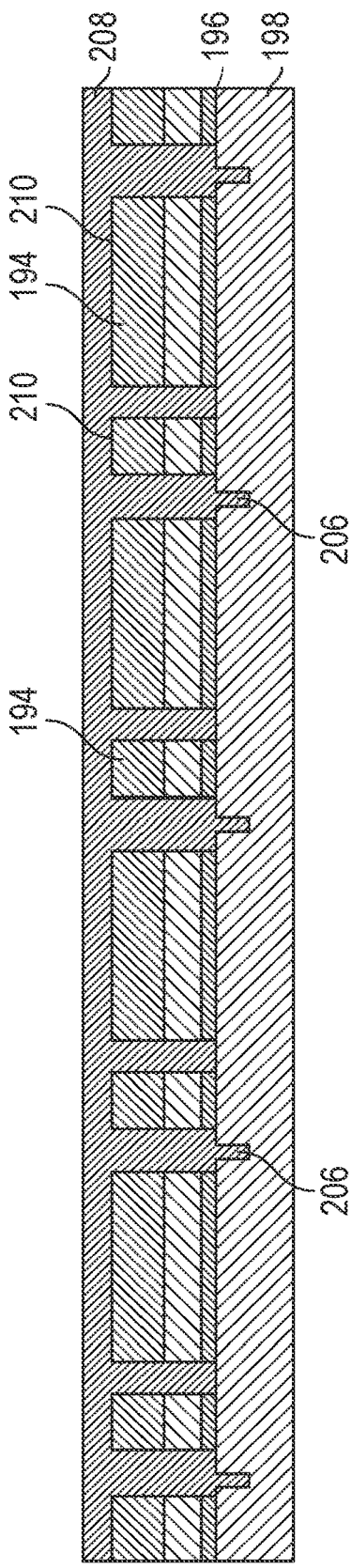

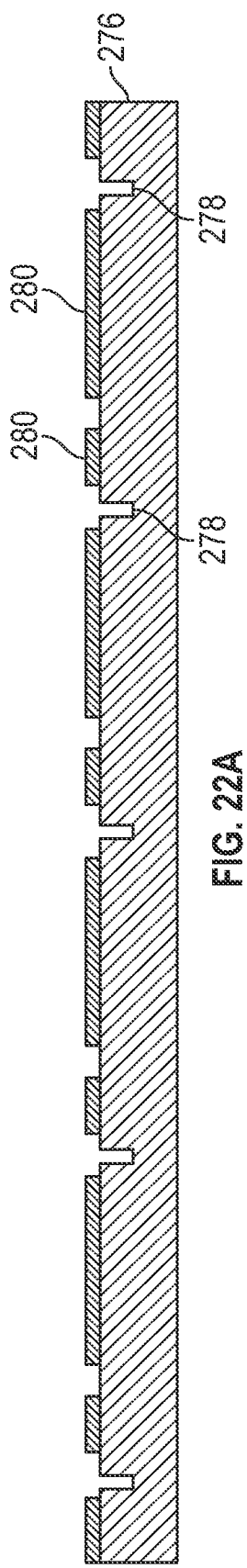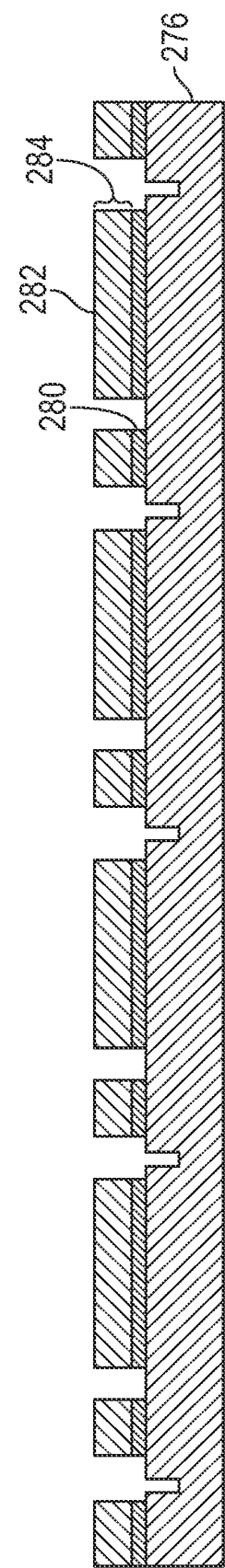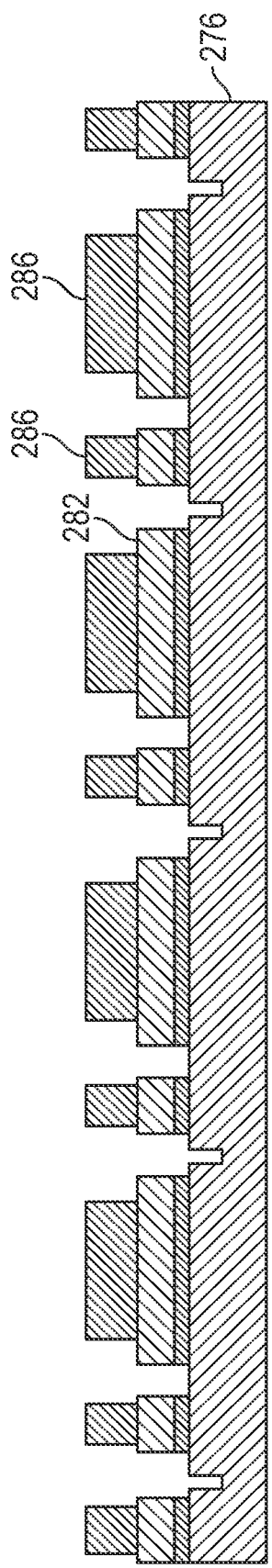

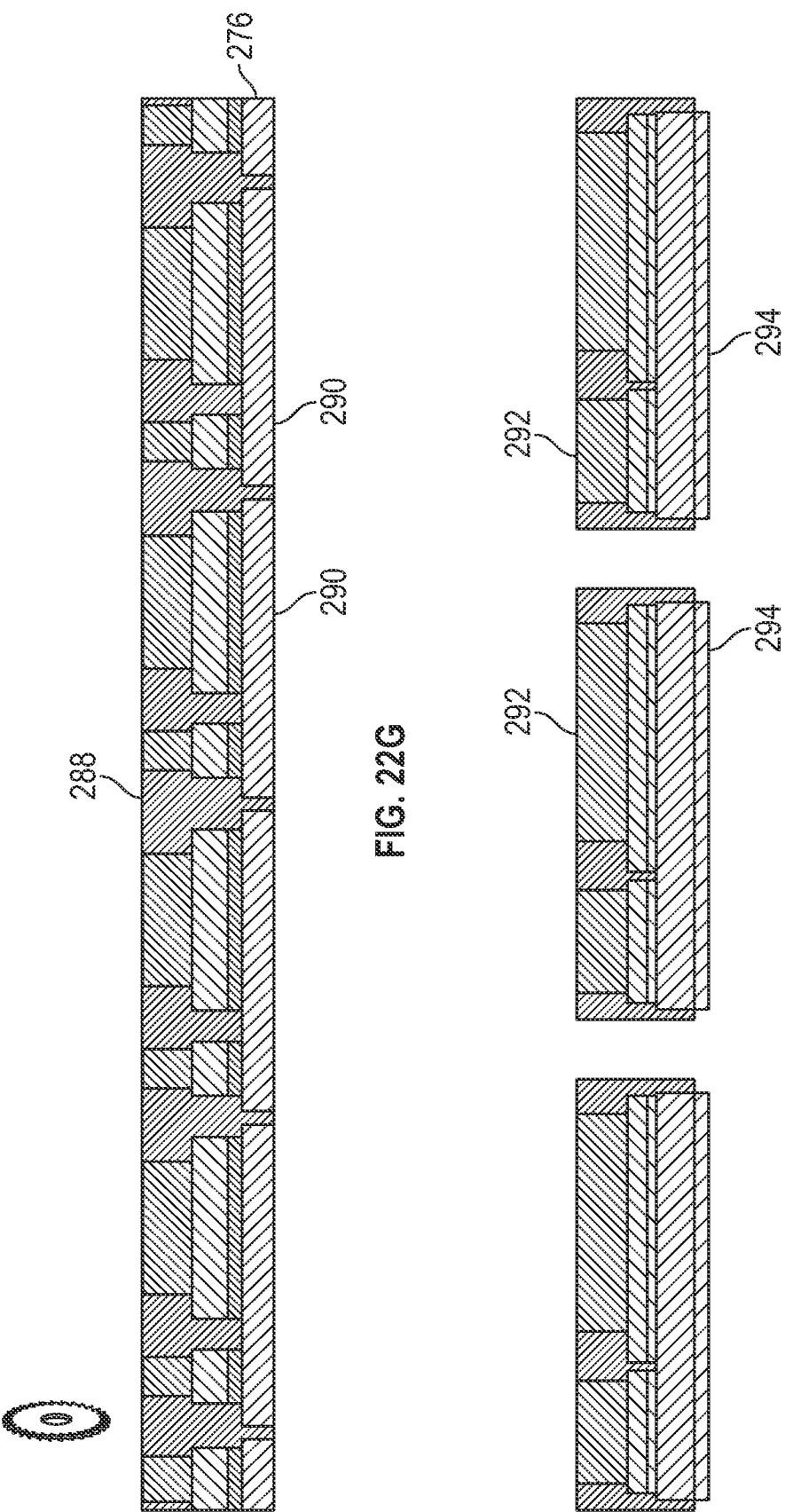

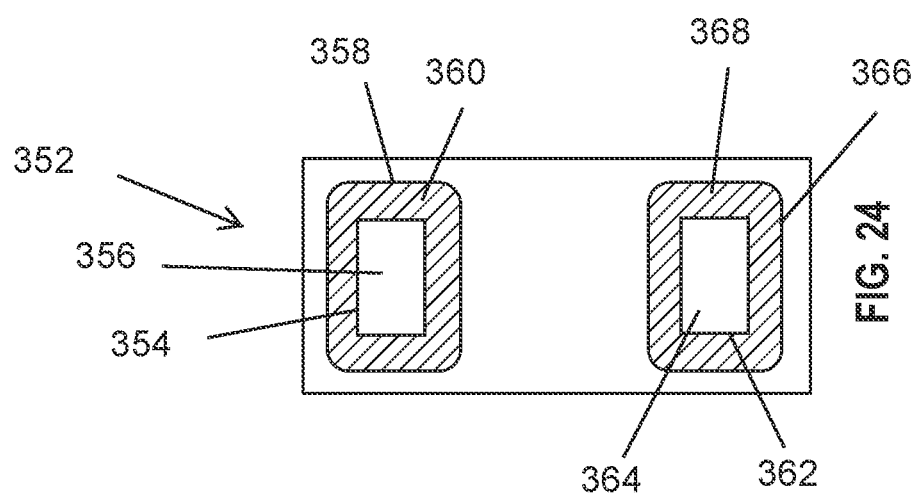

SEMICONDUCTOR PACKAGE ELECTRICAL CONTACT STRUCTURES AND RELATED METHODS

CROSS REFERENCE TO RELATED APPLICATIONS

This application is a continuation-in-part application of the earlier U.S. Utility Patent Application to Eiji Kurose entitled "Multi-Faced Molded Semiconductor Package and Related Methods," application Ser. No. 16/702,958, filed Dec. 4, 2019, now pending; which was a divisional application of the earlier U.S. Utility Patent Application to Eiji Kurose entitled "Multi-Faced Molded Semiconductor Package and Related Methods," application Ser. No. 15/679661, filed Aug. 17, 2017, issued on Jan. 7, 2020 as U.S. Pat. No. 10,529,576, the disclosures of each of which are hereby incorporated entirely herein by reference.

This application is also a continuation-in-part application of the earlier U.S. Utility Patent Application to Lin et al., entitled "Thinned Semiconductor Package and Related Methods," application Ser. No. 15/921,898, filed Mar. 15, 2018, now pending, the disclosure of which is hereby incorporated entirely herein by reference.

BACKGROUND

1. Technical Field

Aspects of this document relate generally to semiconductor packages, such as chip scale packages and flip chip packages. More specific implementations involve semiconductor packages covered by a mold compound.

2. Background

Decreasing semiconductor package size has long been desirable within the industry as it has generally resulted in economic benefits as well as technological benefits. A decrease in semiconductor package size often results in an increase in risk of damage to the semiconductor die and package during manufacturing. A protective cover or molding has generally covered portions of the semiconductor packages to protect the semiconductor from, among other things, the environment, electrostatic discharge, and electrical surges.

SUMMARY

Implementations of a semiconductor package may include a die including a first side and a second side; a first pad and a second pad each coupled to the first side of the die, the first pad and the second pad each including a first layer and a second layer where the second layer may be thicker than the first layer. Implementations may include at least a first conductor directly coupled to the second layer of the first pad, the at least one first conductor having a perimeter entirely within a perimeter of the second layer of the first pad; at least a second conductor directly coupled to the second layer of the second pad, the at least one second conductor having a perimeter entirely within a perimeter of the second layer of the second pad; and an organic material covering at least the first side of the die. Implementations ma include where the at least first conductor and the at least second conductor extend through corresponding openings in the organic material where a spacing between the at least first conductor and the at least second conductor may be wider than a spacing between the second layer of the first pad and the second layer of the second pad.

Implementations of semiconductor packages may include one, all, or any of the following:

The first pad may be a gate pad and the second pad may be a source pad.

The perimeter of the second layer of the second pad may be larger than the perimeter of the second layer of the first pad.

The package may include a backmetal coupled to the second side of the semiconductor die.

The die may have a thickness of 0.1 micron to 125 microns.

The material of the second layer may be one of the same material or a different material from the material of the first layer.

The organic material may be a mold compound.

The package may include a first contact layer coupled directly over the at least first conductor and a second contact layer coupled directly over the at least second contact layer.

The perimeter of the first contact layer may be larger than the perimeter of the at least first conductor and a perimeter of the second contact layer may be larger than the perimeter of the at least second conductor.

Implementations of a semiconductor package may include a die including a first side and a second side; a first pad and a second pad each coupled to the first side of the die, the first pad and the second pad each including a first layer and a second layer where the second layer may be thicker than the first layer. Implementations may include at least a first conductor directly coupled to the second layer of the first pad; at least a second conductor directly coupled to the second layer of the second pad; a first contact layer coupled directly over the at least first conductor and a second contact layer coupled directly over the at least second conductor; and an organic material covering at least the first side of the die. Implementations may include where the at least first conductor and the at least second conductor extend through corresponding openings in the organic material where a spacing between the first contact layer and the second contact layer may be wider than a spacing between the second layer of the first pad and the second layer of the second pad.

Implementations of a semiconductor package may include one, all, or any of the following:

The first pad may be a gate pad and the second pad may be a source pad.

The perimeter of the second layer of the second pad may be larger than a perimeter of the second layer of the first pad.

The package may include a backmetal coupled to the second side of the semiconductor die.

The die may have a thickness of 0.1 micron to 125 microns.

The material of the second layer may be one of the same material or a different material from the material of the first layer.

The organic material may be a mold compound.

Implementations of a method of forming a semiconductor package may include providing a die including a first side and a second side; forming a first layer of a first pad and a second pad on a first side of the die; forming a second layer of the first pad and the second pad, the second layer thicker than the first layer; and forming a first conductor on the first pad. Implementations may include forming a second conductor on the second pad; applying an organic material to the first side of the die; forming a first contact layer over the first conductor; and forming the second contact layer over the second conductor where a spacing between the first contact layer and the second contact layer may be wider than a spacing between the second layer of the first pad and the second layer of the second pad.

Implementations of a method of forming a semiconductor package may include one, all, or any of the following:

The first pad may be a gate pad and the second pad may be a source pad.

The die may have a thickness of 0.1 micron to 125 microns.

The material of the second layer may be one of the same material or a different material from the material of the first layer.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 1 is a cross sectional side view of a semiconductor package;

FIG. 2 is a top view of a semiconductor package;

FIG. 3 is a first process flow illustrating the formation of a semiconductor package;

FIG. 9 is a second process flow illustrating the formation of a semiconductor package;

FIG. 10 is a third process flow illustrating a portion of the formation of a semiconductor package.

FIGS. 18A-18G are cross-section side views illustrating a semiconductor device following various steps of a method for forming the semiconductor package of FIG. 16;

FIGS. 22A-H are cross-section side views of a semiconductor substrate following various steps of a method of forming the semiconductor package of FIG. 20;

FIG. 24 is a top-down view of an implementation of a semiconductor package with a first conductor and second conductor with perimeters smaller than perimeters of a first pad and second pad, respectively.

DESCRIPTION

Figure 4:
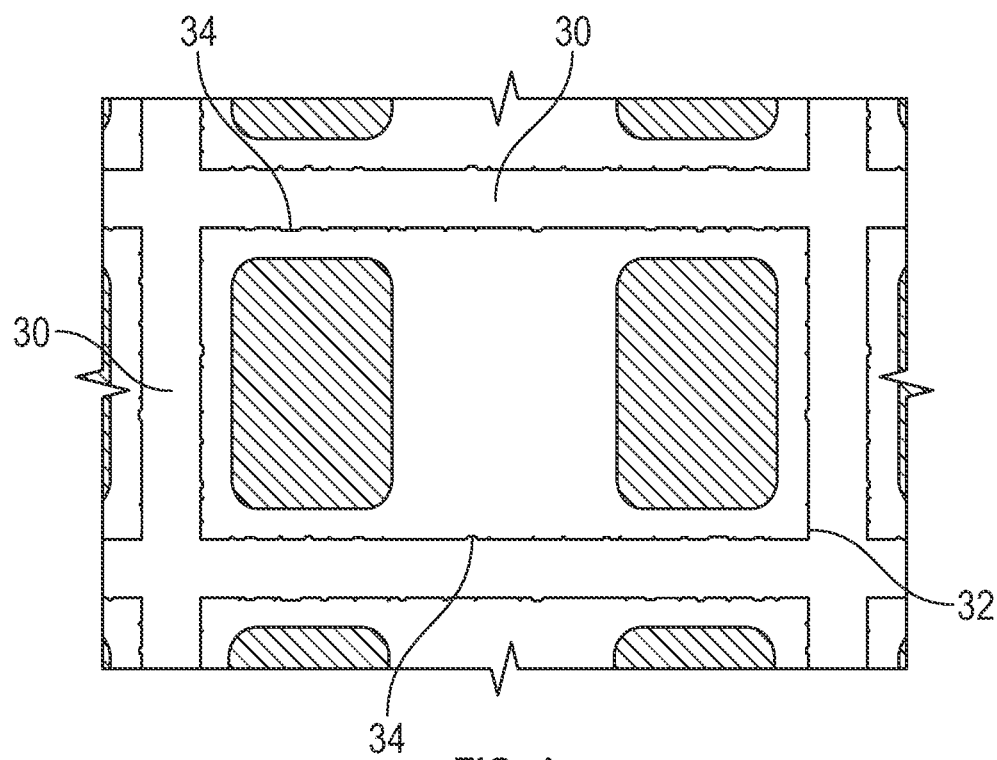
FIG. 4 is a top view of a semiconductor wafer with a plurality of notches cut therein.

This disclosure, its aspects and implementations, are not limited to the specific components, assembly procedures or method elements disclosed herein. Many additional components, assembly procedures and/or method elements known in the art consistent with the intended semiconductor package will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Referring to FIG. 1, a cross sectional side view of a semiconductor package is illustrated. The semiconductor package includes a die 2 which includes a first side 4, a second side 6, a third side 8 opposite the second side 6, a fourth side, a fifth side opposite the fourth side (both fourth and fifth sides are located into and out of the drawing surface in this view), and a sixth side 10 opposite the first side 4. In various implementations, the second side 6 of the die 2, the third side 8 of the die, the fourth side of the die, and/or the fifth side of the die may include a notch therein.

In various implementations, one or more electrical contacts 12 are coupled to the first side 4 of the die 2. In various implementations, the electrical contacts are metal and may be, by non-limiting example, copper, silver, gold, nickel, titanium, aluminum, any combination or alloy thereof, or another metal. In still other implementations, the electrical contacts 12 may not be metallic but may rather be another electrically conductive material.

In various implementations, a first mold compound 14 covers the first, second, third, fourth, and fifth sides of the die. In various implementations, the mold compound may be, by non-limiting example, an epoxy mold compound, an acrylic molding compound, or another type of material capable of physically supporting the die and providing protection against ingress of contaminants. In various implementations, a laminate resin or second mold compound covers the sixth side 10 of the die.

The electrical contacts 12 each extend through a corresponding plurality of openings in the first mold compound 14. In various implementations, the electrical contacts 12 extend beyond the surface of the molding 14, as illustrated in FIG. 1, while in other implementations the electrical contacts are level or flush with the surface of the molding compound 14.

In various implementations, the sides of the die will have no chips or cracks, particularly on the semiconductor device side of the die. This is accomplished through forming the second, third, fourth, and fifth sides of each die using etching techniques rather than a conventional sawing technique. Such a method is more fully disclosed is association with the discussion of FIG. 3 herein.

Further, the first mold compound may be anchored to the second, third, fourth, and fifth sides of the die. In various implementations, the anchor effect is the result of interaction of the mold compound with a plurality of ridges formed along the second, third, fourth, and fifth sides of the die. This anchoring effect is more fully disclose in association with the discussion of FIG. 3 herein.

Referring to FIG. 2, a top view of a semiconductor package is illustrated. The molding compound 14 is clearly seen in FIG. 2 encompassing a perimeter of each electrical contact 12 (the shaded areas in FIG. 2) so that the entire first side of the die (along with every other side) is not exposed.

Referring to FIG. 3, a first process flow illustrating the formation of a semiconductor package is illustrated. In various implementations, the method for making a semiconductor package includes providing a wafer 16 which may include any particular type of substrate material, including, by non-limiting example, silicon, sapphire, ruby, gallium arsenide, glass, or any other semiconductor wafer substrate type. In various implementations, a metal layer 18 is formed on a first side 28 of the wafer 16 and may be formed using a sputtering technique. In other implementations, the metal layer 18 is formed using other techniques, such as, by non-limiting example, electroplating, electroless plating, chemical vapor deposition, and other methods of depositing a metal layer. In a particular implementation, the metal layer is a titanium/copper seed layer, while in other implementations, the metal layer may include, by non-limiting example, copper, titanium, gold, nickel, aluminum, silver, or any combination or alloy thereof.

In various implementations, a first photoresist layer 20 is formed and patterned over the metal layer 18. One or more electrical contacts 22 may be formed on the metal layer 18 and within the photoresist layer 20. In various implementations this may be done using various electroplating or electroless plating techniques, though deposition and etching techniques could be employed in various implementations. The electrical contacts 22 may be any type of electrical contact previously disclosed herein (bumps, studs, and so forth). In various implementations, the first photoresist layer 20 is removed through an ashing or solvent dissolution process and the metal layer 18 may be etched away after the electrical contacts are formed.

In various implementations, a second photoresist layer 24 is formed and patterned over the wafer 16. In various implementations, as illustrated in FIG. 3, the second patterned photoresist layer 24 does not cover the electrical contacts 22. In other implementations, the second photoresist layer is formed conformally over the electrical contacts along with the wafer. Referring to FIG. 9, a second process flow illustrating the formation of a semiconductor package is illustrated. In this process flow, a second photoresist layer 68 is formed as a conformal layer over the electrical contacts 70. Aside from this difference, the process depicted in FIG. 9 includes the same process steps as the process depicted in FIG. 3.

Referring back to FIG. 3, in various implementations, the method includes etching a plurality of notches 26 into the first side 28 of the wafer 16 using the second patterned photoresist layer. In various implementations, the width of the notches may be between about 50 and about 150 microns wide while in other implementations, the width of the notches may be less than about 50 microns or more than about 150 microns. In various implementations, the depth of the plurality of notches 26 may extend between about 25 and 200 microns into the wafer while in other implementations, the depth of the plurality of notches 26 may be less than about 25 microns or more than about 200 microns.

In various implementations, the plurality of notches may be formed using, by non-limiting example, plasma etching, deep-reactive ion etching, or wet chemical etching. In various implementations, a process marketed under the tradename BOSCH® by Robert Bosch GmbH, Stuttgart Germany (the "Bosch process"), may be used to form the plurality of notches 26 in the first side 28 of the wafer 16.

Referring now to FIG. 4, a top view of a conventional semiconductor wafer with a plurality of saw cuts surrounding the plurality of die is illustrated. Using a saw to cut notches in a semiconductor wafer invariably results in the production of chips and cracks on the device side of the die and in the sidewalls 34 of the notches 30. The presence of the cracks and chips has the potential to compromise the reliability of the semiconductor package if the cracks and chips propagate into the device portion of the semiconductor die. Since the saw process involves the rubbing of the rotating blade against the die surface, the chipping and cracking can only be managed through saw processing variables (wafer feed speed, blade kerf width, cut depth, multiple saw cuts, blade materials, etc.) but not eliminated. Furthermore, because the saw process relies on passing the wafer underneath the blades, only square and rectangular sized die are typically produced using conventional saw techniques.

Figure 5:
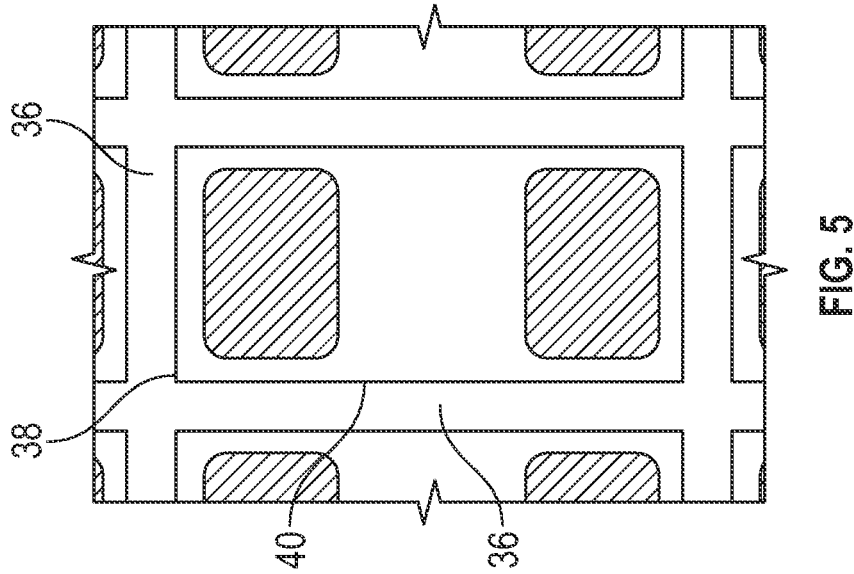
FIG. 5 is a top view of a semiconductor wafer with a plurality of notches etched therein.

Referring to FIG. 5, a top view of a semiconductor wafer with a plurality of notches etched therein is illustrated. In contrast to the appearance of the die processed using the conventional sawing method illustrated in FIG. 4, the plurality of notches 36 in the wafer 38 formed using etching techniques have edges and sidewalls 40 that do not exhibit cracks or chips therein. Because of the absence of the cracks and chips, the use of etching techniques to form a plurality of notches in a semiconductor wafer is likely to improve the reliability of the resulting semiconductor packages.

Figure 7:
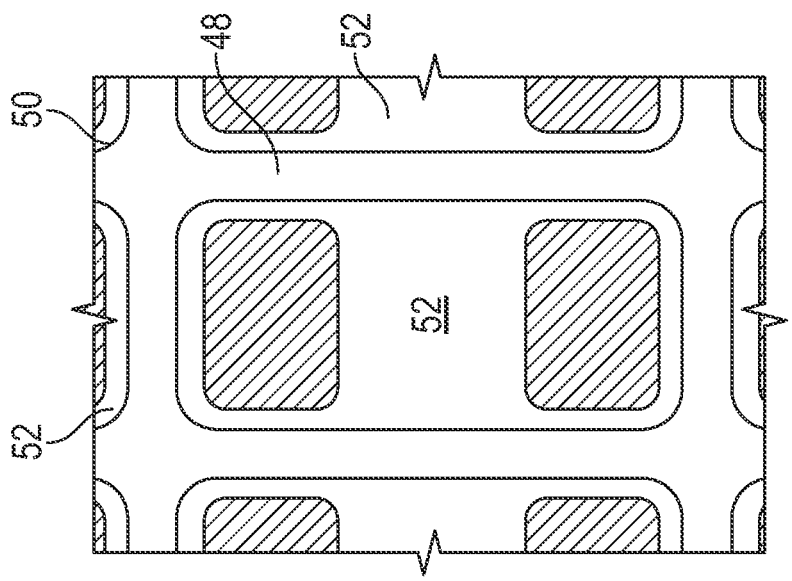
FIG. 7 is a top view of a third implementations of a semiconductor wafer with a plurality of notches etched therein.
Figure 6:
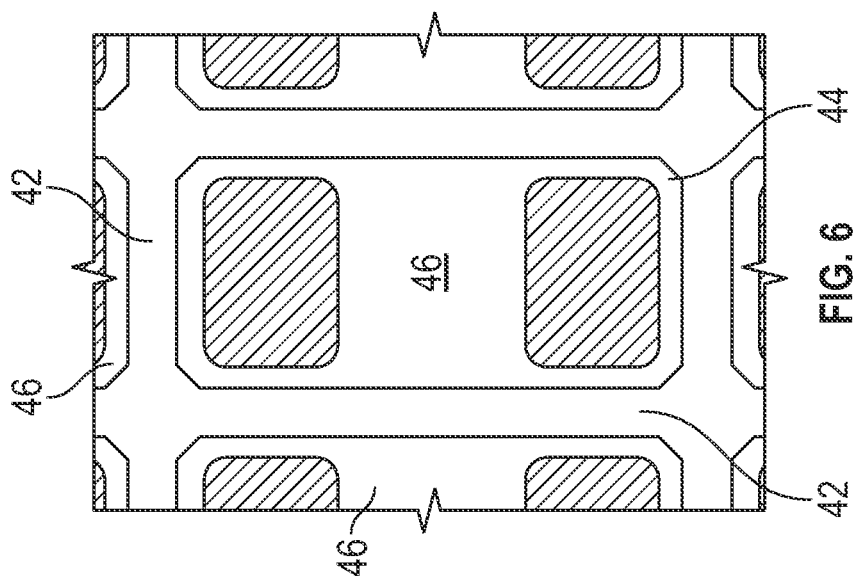
FIG. 6 is a top view of a second implementation of a semiconductor wafer with a plurality of notches etched therein.

Furthermore, using etching techniques to form a plurality of notches in a wafer allows for different shapes of perimeters of die to be produced. In various implementations, the second photoresist layer described in relation to FIG. 3 may be patterned in a way to form a plurality of notches that do not form die with rectangular perimeters. For example, referring to FIG. 6, a top view of a second implementation of a semiconductor wafer with a plurality of notches etched therein is illustrated. In various implementations, a plurality of notches 42 may be formed in a wafer 44. The plurality of notches 42 may form eventual die 46 with perimeters that are octagons. Referring to FIG. 7, a top view of a third implementations of a semiconductor wafer with a plurality of notches etched therein is illustrated. In various implementations, a plurality of notches 48 may be formed in a wafer 50. The plurality of notches 48 may form eventual die 52 with perimeters that are rounded rectangles. In other implementations, a plurality of notches may be formed in a wafer that form eventual die with perimeters that are any other closed geometrical shape.

Referring back to FIG. 3, in various implementations, the plurality of notches 26 formed have two substantially parallel sidewalls that extend substantially straight into the first side 28 of the wafer 16. In other implementations, two or more stepwise notches are formed in the first side 28 of the wafer 16. Each stepwise notch may be formed by creating a first notch in the wafer, and then forming a second more narrow notch within each first notch.

Referring to FIG. 3, an implementation of a method for forming a semiconductor package includes applying a first mold compound 54 into the plurality of notches 26 and over the first side of the wafer. In various implementations, as illustrated by FIG. 3, the first mold compound 54 may cover the electrical contacts 22. In other implementations, the first mold compound 54 may not completely cover the electrical contacts 22. The first mold compound may be applied using, by non-limiting example, a liquid dispensing technique, a transfer molding technique, a printer molding technique, or a compression molding technique. The molding compound may be an epoxy molding compound, an acrylic molding compound, or another type of molding compound disclosed herein.

Figure 8:
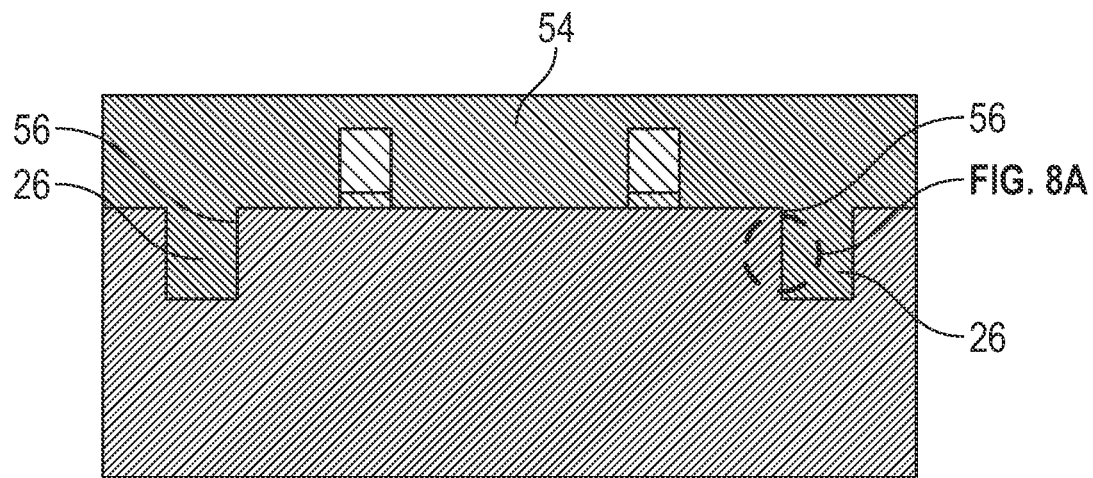
FIG. 8 is a cross sectional view of a portion of a wafer with molding applied thereto.
Figure 8A:
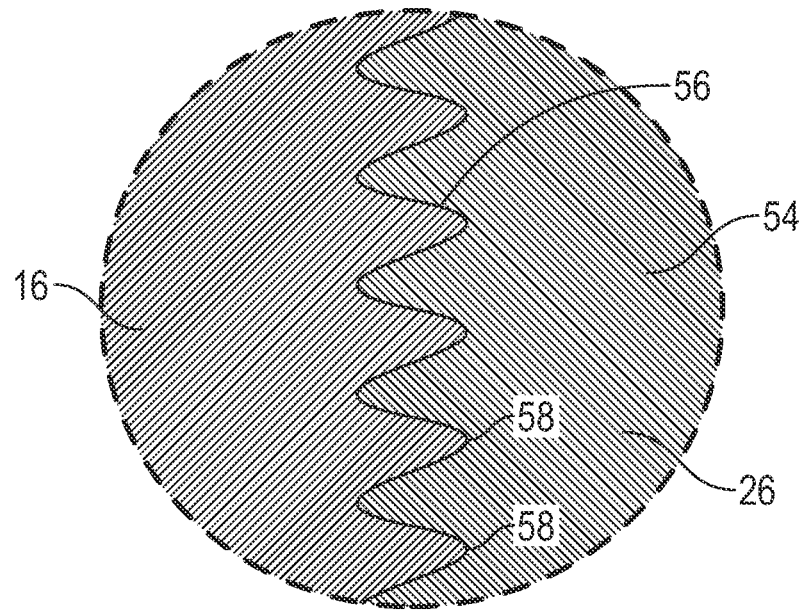
FIG. 8A is a magnified cross sectional view of the bond between a mold and a sidewall of a notch formed in the die.

In various implementations, the first mold compound 54 may be anchored to a plurality of sidewalls 56 of a plurality of notches 26. Referring now to FIG. 8, a cross sectional view of a portion of a wafer with molding applied thereto is illustrated. Referring now to FIG. 8A, a magnified cross sectional view of the bond between a mold and a sidewall of a notch formed in the die is illustrated. In various implementations, a plurality of ridges 58 may be formed in a sidewall 56 of each notch within the plurality of notches. In a particular implementation, the height of each ridge extending from the sidewall is substantially 0.2 microns tall with a pitch of substantially one micron. Thus, in implementations where the notch is 150 microns deep, there may be substantially 150 microns on each sidewall of the notch. In other implementations, the notches may be taller or shorter than 0.2 microns and may have a pitch more or less than one micron. The ridges may anchor the first mold compound 54 to the sidewalls 56 of the plurality of notches. In various implementations where the plurality of notches are etched using the Bosch process, the etching process may form ridges in the plurality of notches while etching the plurality of notches via the deposition/etching cycles of the deep reactive ion etch, thus increasing the adhesion between the first mold compound and the sidewall of each notch.

Referring back to FIG. 3, in various implementations where the first mold compound 54 covers the electrical contacts 22, the electrical contacts 22 may be exposed by grinding the first mold compound. In various implementations, a second side 60 of the wafer 16 may be ground to the plurality of notches 26 formed in the first side 28 of the wafer 16. In this way the various die of the semiconductor wafer are singulated from each other. In various implementations, the second side 60 of the wafer 16 may be ground using, by non-limiting example, a mechanical polishing technique, a chemical etching technique, a combination of a mechanical polishing and chemical etching technique, or any other grinding technique.

In various implementations, a second mold compound 62 or a laminate resin may be applied to the second side 60 of the wafer 16. In implementations where a second mold compound is applied, the mold compound may be any type of mold compound disclosed herein and may be applied using any technique disclosed herein.

In various implementations, as illustrated in the process flow depicted in FIG. 3, the first mold compound 54 is ground to expose the electrical contacts 22 before the second side 60 of the wafer 16 is ground and the second mold compound is applied. In other implementations, the first mold compound 54 may be ground to expose the electrical contacts 22 after the second side 60 of the wafer 16 is ground and the second mold compound is applied.

The method for making a semiconductor package includes singulating the wafer 16 into a plurality of semiconductor packages 64. The wafer 16 may be singulated by cutting or etching through the wafer where the plurality of notches 26 were originally formed. The wafer may be singulated by using, by non-limiting example, a saw, a laser, a waterjet, plasma etching, deep reactive-ion etching, or chemical etching. In various implementations, the Bosch process may be used to singulate the wafer 16. The method used to singulate the wafer may include singulating the wafer using thinner cuts or etches than were used to form the plurality of notches 26. In this manner, the first mold compound will cover the sides of each singulated die 66 within each semiconductor package 64. Specifically, in particular implementations the saw width used to singulate each semiconductor package may be between 20 and 40 microns thick. The semiconductor die within the semiconductor package may be covered by either a mold compound or a laminate resin on all six sides of the semiconductor die.

In various implementations, the first side of the die within each semiconductor package may include a perimeter that is, by non-limiting example, a rectangle, an octagon, a rectangle with rounded edges, or any other closed geometric shape.

Referring now to FIG. 10, a third process flow illustrating a portion of the formation of a semiconductor package is illustrated. In various implementations the method for forming a semiconductor package includes providing a wafer 72, which may be any type of wafer substrate disclosed herein. In various implementations, one or more metal pads 74 may be coupled to a first side 76 of the wafer 72. The metal pad may include, by non-limiting example, aluminum, copper, nickel silver, gold, titanium, or any combination or alloy thereof.

In various implementations, a first passivation layer 78 may be coupled to a portion of the first side 76 of the wafer 72. The first passivation layer 78 may be a silicon dioxide passivation layer in various implementations, though it could be any of a wide variety of other types of layers, including, by non-limiting example, silicon nitride, polyimide, or another polymer or deposited material. In various implementations, a second passivation layer 80 may be coupled to a portion of the first side 76 of the wafer 72. The second passivation layer 80 may be a silicon nitride passivation layer. The second passivation layer may include the same material or a different material from the first passivation layer.

In various implementations, a third layer 82 may be coupled to a portion of the first side 76 of the wafer 72. The third layer may be either a polyimide, a polybenzoxazole, a phenol resin, or a combination of a polyimide, a polybenzoxazole, and a phenol resin. In various implementations, a metal seed layer 84 may be formed over the third layer and over the first side 76 of the wafer 72. The metal seed layer 84 may be any type of metal layer disclosed herein. In various implementations, the metal seed layer 84 may directly contact portions of the first side 76 of the wafer 72. In various implementations, the method includes forming and patterning a first photoresist layer 86 over the metal seed layer 84.

In various implementations, the method includes forming electrical contacts 88 coupled to the metal seed layer 84 and within the first photoresist layer 86. The electrical contacts 88 may be any type of electrical contact disclosed herein. In various implementations, the electrical contacts 88 may include a first layer 90 and a second layer 92. In various implementations, the first layer 90 may include copper and the second layer 92 may include tin, silver, or a combination of tin and silver. In various implementations, the method of forming a semiconductor package includes removing the first photoresist layer 86 and etching the portions of the metal seed layer 84 away that are not covered by the electrical contacts, after the electrical contacts are formed.

In various implementations, the method of forming a semiconductor package includes forming and patterning a second photoresist layer 94 over the first side 76 of the wafer 72. In various implementations, the second photoresist layer covers the electrical contacts 88, while in other implementations, the second photoresist layer 94 does not cover the electrical contacts 88. The second photoresist layer 94 may be used to etch a plurality of notches 96 into the wafer 72. The method includes removing the second photoresist layer 94 after the plurality of notches are etched into the wafer.

A first mold compound may be applied into the plurality of notches and over the first side 76 of the wafer 72 in the same manner the first mold compound in FIG. 3 is applied. The remainder of the method for forming a semiconductor package as depicted in FIG. 10 may include exposing the electrical contacts through grinding, grinding the backside of the wafer to the plurality of notches, applying a second mold compound or laminate resin to a backside of the wafer, and singulating the wafer into a plurality of semiconductor packages. These portions of forming a semiconductor package may be the same as or similar to respective portions for forming a semiconductor package illustrated by FIG. 3 and previously disclosed herein.

In various implementations, the semiconductor package produced by the method depicted in FIG. 10 may include one or more metal pads, one or more passivation layers, a polyimide, a phenol resin, a polybenzoxazole, and any combination thereof, between the semiconductor die and the first mold compound.

Figure 11:
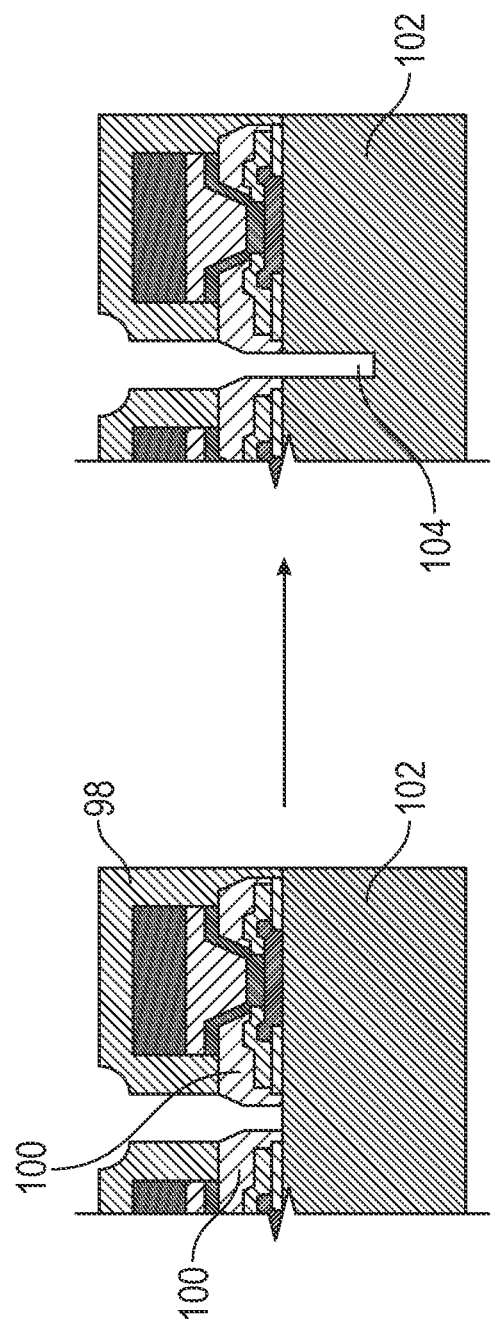
FIG. 11 illustrates a first alternative for forming the notches in the third process flow.

Referring to FIGS. 11-14, alternative methods for forming a plurality of notches in the process illustrated by FIG. 10 is illustrated. Referring to FIG. 11, a method of forming a plurality of notches using a patterned photoresist layer and one of a polyimide, polybenzoxazole, and a phenol resin in combination with an etching process is illustrated. In various implementations, a patterned photoresist layer 98 may be over a mask 100 including either a patterned polyimide layer, a patterned polybenzoxazole layer, or a patterned phenol resin layer. The mask 100 may be over a wafer 102. A notch 104 may be formed in the wafer 102 using the patterned photoresist layer and the mask using any etching process disclosed herein.

Figure 12:
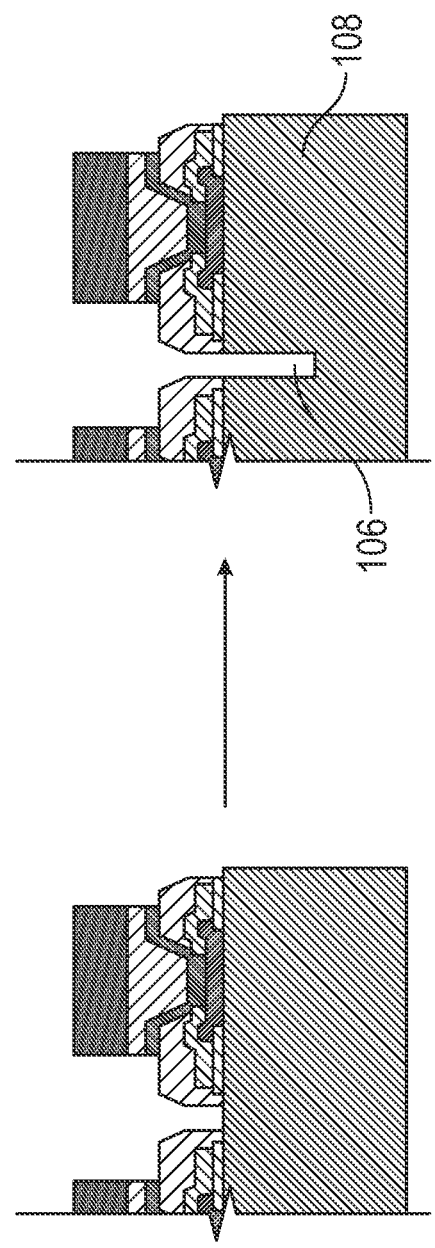
FIG. 12 illustrates a second alternative for forming the notches in the third process flow.

Referring to FIG. 12, a method of forming a plurality of notches using one of a polyimide, polybenzoxazole, and a phenol resin in combination with any etching process disclosed herein is illustrated. The method may be the same as the method depicted by FIG. 11, with the difference being that the method depicted by FIG. 12 does not include a patterned photoresist layer used to form a notch 106 into a wafer 108.

Figure 13:
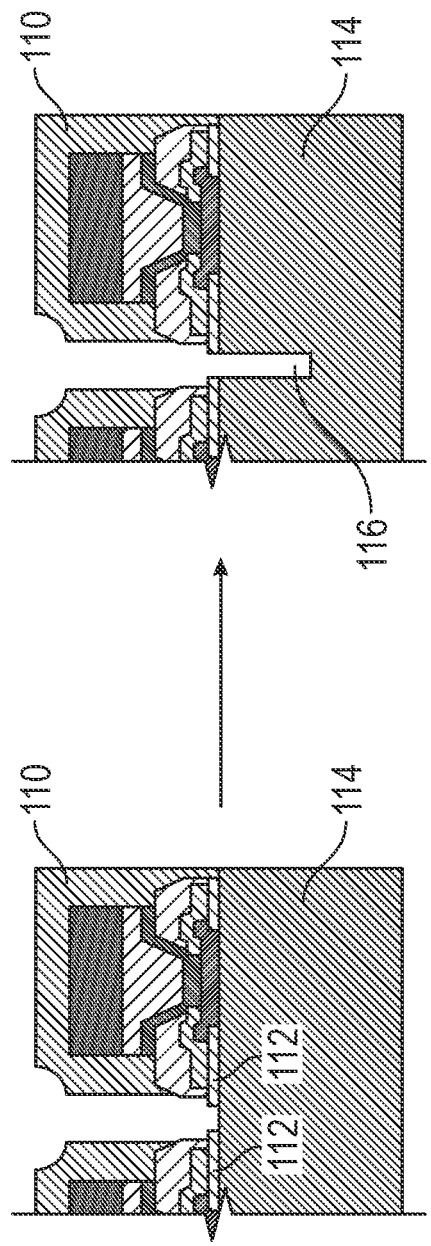
FIG. 13 illustrates a third alternative for forming the notches in the third process flow.

Referring to FIG. 13, a method of forming a plurality of notches using a patterned photoresist layer and passivation mask is illustrated. In various implementations, a patterned photoresist layer 110 may be over a passivation mask 112. The passivation mask 112 may include any passivation layer disclosed herein. The passivation mask 112 may be over a wafer 114. A notch 116 may be formed in the wafer 114 using the patterned photoresist layer 110 and the passivation mask 112 and any etching process disclosed herein.

Figure 14:
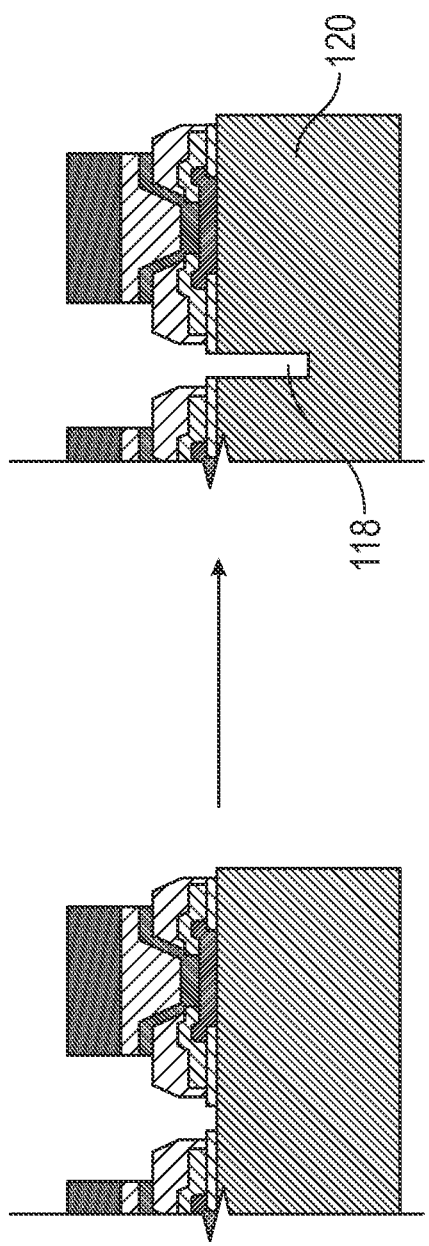
FIG. 14 illustrates a fourth alternative for forming the notches in the third process flow.

Referring to FIG. 14, a method of forming a plurality of notches using a passivation mask in combination with any of the etching method disclosed herein is illustrated. The method may be the same as the method depicted by FIG. 13, with the difference being that the method depicted by FIG. 14 does not include a patterned photoresist layer used to form a notch 116 into a wafer 118.

Figure 15:
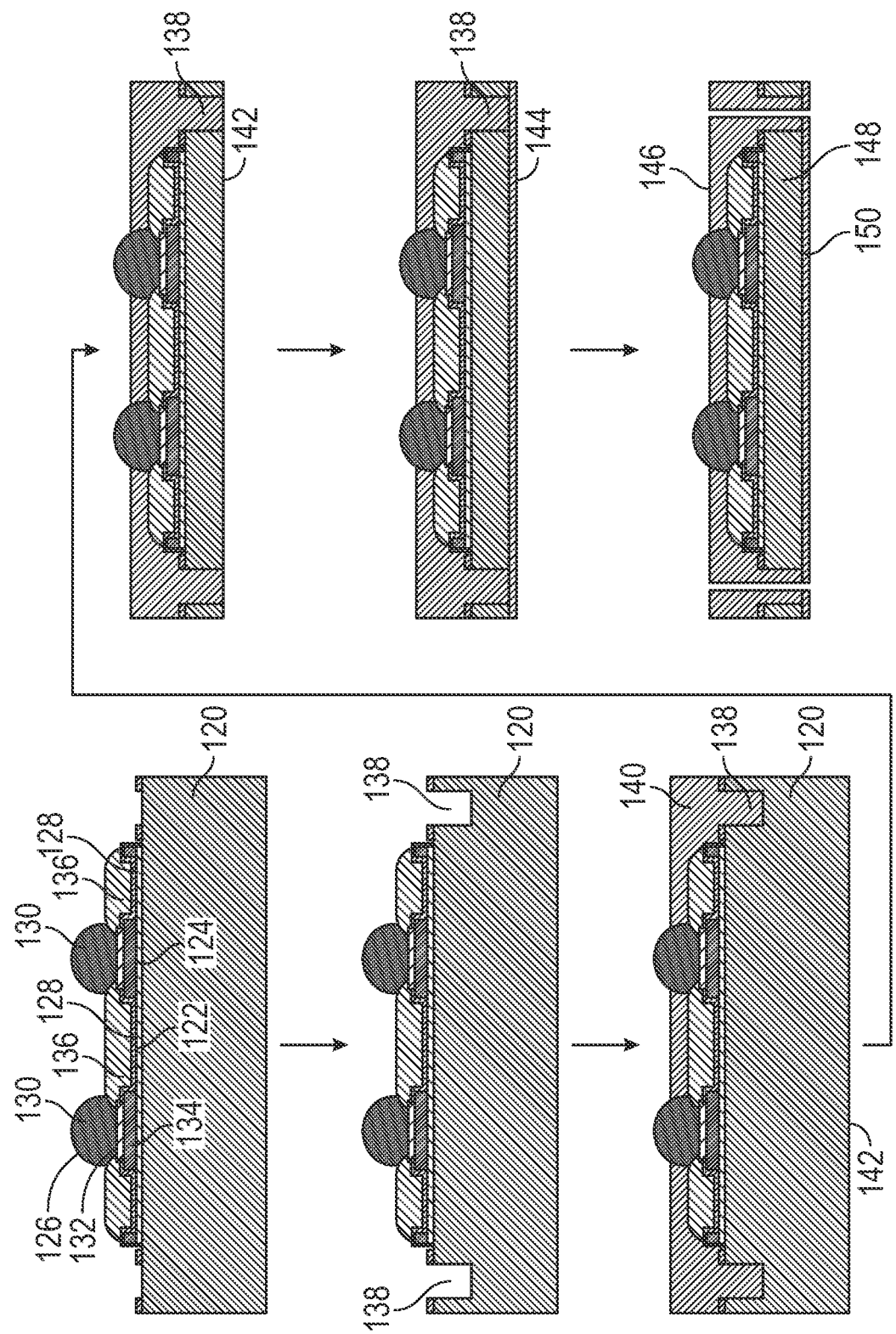
FIG. 15 is a fourth process flow illustrating the formation of a semiconductor package.

Referring to FIG. 15, a fourth process flow illustrating the formation of a semiconductor package is illustrated. The method for forming a semiconductor package illustrated in FIG. 15 includes providing a wafer 120. In various implementations, an interlayer 122 may be coupled to a first side 124 of the wafer 120. In various implementations, a passivation layer 128 may be coupled to the wafer 120. The passivation layer may be any type of passivation layer disclosed herein.

In various implementations, one or more electrical contacts 126 may be coupled to the wafer 120. In various implementations, the electrical contacts include a bump 130. The electrical contacts may include a first metal layer 132 coupled to the bump 130. The first metal layer may include any metal disclosed herein. In a particular implementation, the first metal layer includes nickel and gold. The electrical contacts 128 may include a second metal layer 134 coupled to the first metal layer 132. The second metal layer 134 may include any metal disclosed herein. In a particular implementation, the second metal layer 134 includes aluminum. In various implementations, a solder resist layer 136 may be coupled over the wafer 120. In other implementations, no solder resist layer is included.

In various implementations, the passivation layer 128 may be patterned and may directly contact portions of the wafer 120. In such implementations, the patterned passivation layer, or mask, may be used to etch a plurality of notches 138 into the first side 124 of the wafer 120 using any etching process disclosed herein. The plurality of notches may be etched using any method disclosed herein, and may be any type of notch previously disclosed herein.

In various implementations, a first mold compound 140 is applied into the plurality of notches 138 and over the first wafer 120. The first mold compound 140 may be any mold compound disclosed herein and may be applied using any technique disclosed herein. In various implementations, the first mold compound 140 does not entirely cover the electrical contacts 126, as is illustrated by FIG. 15. In other implementations, the first mold compound does entirely cover the electrical contacts 126. In implementations where the first mold compound 140 does entirely cover the electrical contacts 126, the first mold compound may be ground to expose the electrical contacts 126.

In various implementations, a second side 142 opposite the first side 124 of the wafer 120 may be ground using any grinding method disclosed herein to the plurality of notches. A second mold compound 144 or laminate resin may then be applied to the second side 142 of the wafer 120.

The wafer 120 may then be singulated into a plurality of semiconductor packages 146. The wafer may be singulated using any technique disclosed herein. The semiconductor die 148 with the semiconductor package 146 may have all six sides covered by a mold compound. In other implementations, the sixth side of the die 150 may be covered by a laminate resin.

In various implementations, the semiconductor package formed by the method illustrated in FIG. 15 may include either a solder resist layer, a passivation layer, an interlayer, or a combination of a solder resist layer, a passivation layer, and an interlayer coupled to the first side of the wafer and covered by the first mold compound.

Figure 16:
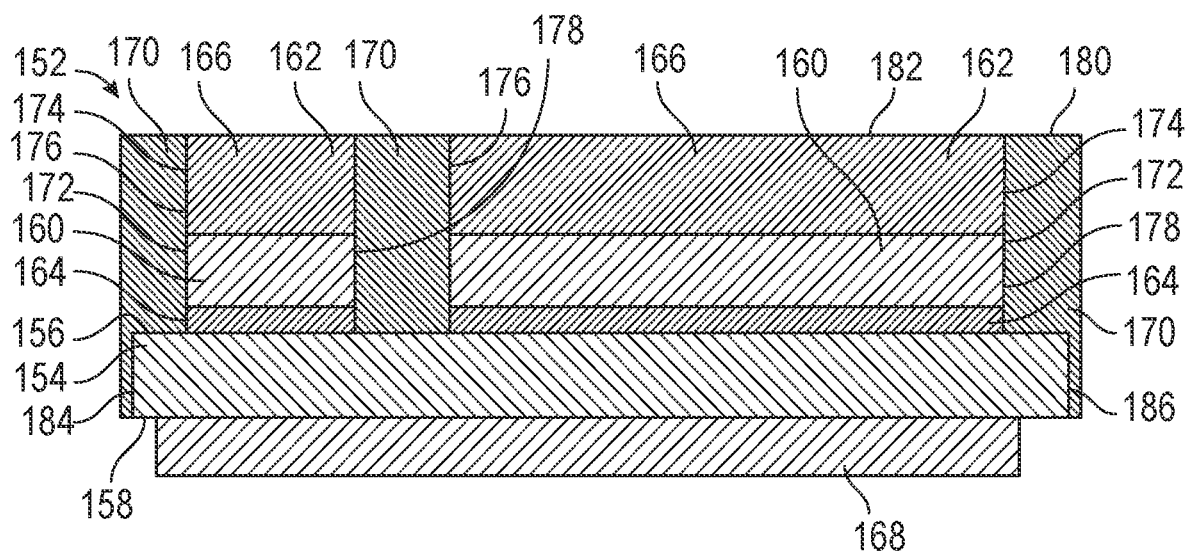
FIG. 16 is a cross-section side view of an implementation of a semiconductor package.

Referring to FIG. 16, a cross-section side view of an implementation of a semiconductor package is illustrated. In various implementations, the semiconductor packages disclosed herein may include power semiconductor devices, however, in other implementations other semiconductor device types (transistors, microprocessors, passive components, etc.) may be included in the semiconductor packages. In various implementations, the semiconductor package 152 includes a die 154. The die 154 may be a silicon die, and in such implementations, the silicon die could be any type of silicon die including, by non-limiting example, an epitaxial silicon die, silicon-on-insulator, polysilicon, any combination thereof, or any other silicon-containing die material. Further, it is also understood that in various implementations a die other than a silicon-containing die may be used, such as, by non-limiting example, gallium arsenide, silicon carbide, gallium arsenide, or a metal-containing die. The die 154 has a first side 156 and a second side 158 opposite the first side. In various implementations, the thickness of the die 154 is less than 50 micrometers (um), however, in other implementations the thickness of the die may be 50 um or more than 50 um.

In various implementations, the semiconductor package 152 may include a first metal layer 160 coupled to the first side 156 of the die 154. In such implementations, the first metal layer 160 may be, by non-limiting example, copper, aluminum, tin, silver, gold, titanium, nickel, or any other metal or metal alloy. In various implementations, the first metal layer 160 may be directly coupled to the first side 156 of the die 154, while in other implementations, as is illustrated by FIG. 16, the first metal layer may be indirectly coupled to the die 154. In various implementations, the semiconductor package 152 may include a tin layer 162 coupled to the first metal layer 160. While this disclosure primarily refers to a tin layer coupled over the first metal layer, it is understood that any other electrically and/or thermally conductive material, including any metal or metal alloy disclosed herein, may be used in place of the tin. Also, the tin used in the tin layer may be tin or a tin alloy, such as, by non-limiting example, tin/silver, tin/silver/copper, tin/antimony, and tin/lead. In various implementations, and as illustrated by FIG. 16, the tin layer 162 may be directly coupled to the first metal layer 160 with the first metal layer 160 between the tin layer and the die 154. In other implementations the tin layer 162 may be indirectly coupled to the first metal layer 160.

In various implementations, the semiconductor package 152 may include a second metal layer 164 coupled between the die 154 and the first metal layer 160. In such implementations, the semiconductor package 152 includes at least three metal layers over the die 154. The second metal layer 164 may be any type of metal or metal alloy disclosed herein. In particular implementations, the second metal layer may include tin or a tin alloy, such as, by non-limiting example, tin/silver, tin/silver/copper, tin/antimony, and tin/lead. In other particular implementations, the second metal layer 164 may include aluminum, the first metal layer 160 may include copper, and the tin layer 162 may be over and coupled to the copper layer.

In various implementations, the tin layer 162 and the first metal layer 160 may be formed into and include a plurality of bumps/studs 166. In implementations including a second metal layer 164 between the first metal layer 160 and the die 154, the second metal layer 164 may also be patterned to form a portion of the plurality of bumps 166. In particular implementations, not all three metal layers are patterned to form a plurality of bumps, but only the two outermost metal layers (in implementations having three or more metal layers over the die 154) include the plurality of bumps. In still other implementations, only the tin layer 162 may be patterned to form or include the plurality of bumps. In various implementations, and as illustrated by FIG. 16, the plurality of bumps 166 may include two bumps, however, in other implementations the plurality of bumps may include more than two bumps.

In various implementations, rather than having a plurality of metal layers forming the bumps as illustrated by FIG. 16, a single metal or metal alloy layer, including, by non-limiting example, copper, aluminum, tin, a solder, or any combination thereof, may form the plurality of bumps and may be directly coupled to the die 154. In other implementations, and as illustrated by FIG. 16, each bump of the plurality of bumps 166 may include multiple layers with a tin layer 162 coupled over the copper layer. In such implementations, the semiconductor package 152 may have the benefit of being able to bond to external connections through the tin layer 162 while also maintaining the benefit of having a copper bump or stud. In various implementations, the tin layer 162 may be much thinner than the first metal layer 160, while in other implementations, the tin layer 162 may be as thick as or thicker than the first metal layer 160. In implementations with a second metal layer 164 coupled between the first metal layer 160 and the die 154, the second metal layer may be less thick, as thick, or more thick than the first metal layer when viewed in a cross sectional view of the die 154.

In various implementations, the semiconductor package 152 may include a backside metal layer 168 coupled to the second side 158 of the die 154. The backside metal layer 168 may be any metal disclosed herein, and in various implementations, may include copper. In particular implementations, the backside metal layer may include, by non-limiting example, Ti/Ni/Cu, Ti/Cu, TiW/Cu, or any other type of metal stack or metal alloy including copper. In various implementations, and as illustrated by FIG. 16, the length of the backside metal layer 168 may be less than the length of the die 154. In such implementations, the die 154 may overhang the backside metal layer 168. In other implementations, the length of the backmetal layer 168 may be substantially the same as the length of the die 154 with the sides of the backmetal layer coextensive with the sides/perimeter of the die. In still other implementations, the back metal layer may extend beyond the sides/perimeter of the die 154. In various implementations, the back metal layer may be patterned.

Still referring to FIG. 16, in various implementations the semiconductor package 152 may include a mold compound 170. The mold compound 170 may be coupled to the die 154. In various implementations, the mold compound may include, by non-limiting example, an epoxy mold compound, an acrylic mold compound, or any other type of mold compound or protective covering capable of hardening and providing physical support and protection to a semiconductor device. In various implementations, the mold compound 170 may cover a plurality of sidewalls 172 of the first metal layer 160 and a plurality of sidewalls 174 of the tin layer. In implementations with a plurality of bumps 166, the mold compound may cover a first side 176 and a second side 178 of each bump. In various implementations, a surface 180 of the mold compound may be substantially coplanar and level with a surface 182 of the tin layer 162. In various implementations, and as is illustrated by FIG. 16, the mold compound 170 may cover the sides of the die. Specifically, the mold compound 170 may cover a third side 184 of the die 154, a fourth side 186 of the die 154, a fifth side (oriented as going into the page in FIG. 16) of the die, and a sixth side (oriented as coming off the page in FIG. 16) of the die. In the implementation illustrated by FIG. 16, the entirety of the sides of the die are covered by the mold compound 170, however, in other implementations the sides of the die 154 may only partially be covered by a mold compound 170, while in still other implementations the mold compound 170 may not cover the sides of the die 154. In various implementations, a portion of the second side 158 of the die may be covered by a mold compound. The mold compound covering the second side of the die 154 may be the same or a separate mold compound from the mold compound 170. In such implementations, the mold compound 170 may also cover the sides of the backmetal layer 168 in implementations where the backmetal layer is the same length as or shorter than the length of the die 154.

Figure 17:
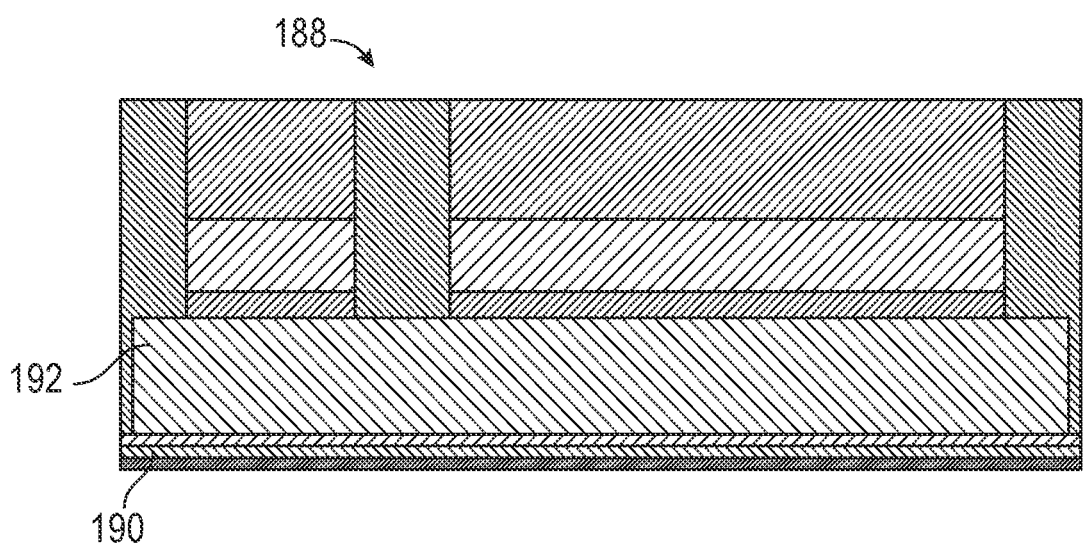
FIG. 17 is a cross-section side view of an implementation of a semiconductor package.

Referring to FIG. 17, a cross-section side view of a second implementation of a semiconductor package is illustrated. The semiconductor package of FIG. 17 may be similar to the semiconductor package of FIG. 17, with the difference being that the backside metal layer 190 may extend beyond the length of the die 192 and may be coextensive with the sides/perimeter of the semiconductor package 188. Further, as illustrated by FIG. 17, the backside metal layer 190 may include multiple layers, and in particular implementations, may include three layers. The backside metal layer may include, by non-limiting example, a metal or metal alloy including titanium, nickel, silver, vanadium, copper, and any combination thereof. In particular implementations, the backmetal layer 190 may include a layer including titanium, a layer including nickel, and a layer including a silver copper alloy. In other particular implementations, the backmetal layer may include a layer including titanium, a layer including a nickel vanadium alloy, and a layer including a silver-copper alloy.

Figure 18D:
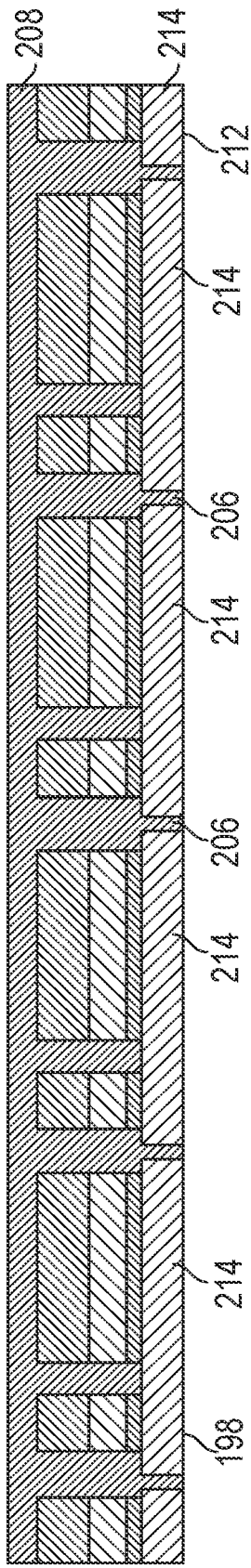

Referring to FIGS. 18A-18G, cross-section side views of a semiconductor device following various steps of an implementation of a method for forming the semiconductor package of FIG. 16 are illustrated. Referring specifically to FIGS. 18A-18B, a method for forming the semiconductor package of FIG. 16 may include forming a plurality of bumps/studs 194 on a first side 196 of a wafer 198. More specifically, the method may include forming a third metal 200 on the first side 196 of the wafer 198. The third metal layer 200 may be any metal disclosed herein, and in particular implementations, may include aluminum. The third metal layer 200 may be patterned, as illustrated by FIG. 18A, however, in other implementations the third metal layer may not necessarily be patterned.

Referring to FIG. 18B, the method may include forming a first metal layer 202 over the third metal layer 200. The first metal layer 202 may be any metal disclosed herein, and in particular implementations, includes copper. The first metal layer 202 may be patterned, as illustrated by FIG. 18B, however, in other implementations the first metal layer may not be patterned. In various implementations, the method may also include forming a second metal layer 204 over the first metal layer 202. The second metal layer 204 may be any metal disclosed herein, and in particular implementations, includes tin. The second metal layer 204 may also include a solder material. The second metal layer 204 may be patterned as illustrated by FIG. 18B, however, in other implementations where additional conductive layers cover the second metal layer 204, the second metal layer may not necessarily be patterned.

In various implementations, the method for forming the semiconductor package of FIG. 16 includes forming non-patterned metal layers over the first side 196 of the wafer 198. The method may then include etching through any number of the metal layers, including all of the metal layers coupled over the first side 196 of the wafer 198, in order to form the plurality of bumps 194. In various implementations, less than three metal layers may be coupled over the first side 196 of the wafer 198, and in particular implementations, only a single metal layer may be formed and coupled directly to the first side 196 of the wafer 198. In other implementations, more than three metal layers may be formed over the first side 196 of the wafer 198. The metal layers coupled to the first side 196 of the wafer 198 may be used to form any number of bumps over the wafer.

Referring specifically to FIG. 18B, the method for forming the semiconductor package of FIG. 16 may include forming a plurality of recesses 206 into the first side 196 of the wafer 198 to a desired depth into the wafer. In particular implementations, the depth of each recess of the plurality of recesses 206 may be less than 50 um, while in other implementations the depth may be 50 or more micrometers depending on the thickness of the wafer. In various implementations, the plurality of recesses 206 may be formed using a saw, a laser, a plasma etch, a chemical etch, or any other method for forming a recess in a wafer. In implementations where an etch is used, the etch may be an etching process marketed under the tradename BOSCH® (the "Bosch process") by Robert Bosch GmbH, Stuttgart, Germany, may be used to form the plurality of recesses 206 in the wafer 198. In such implementations, the sidewalls of the plurality of recesses 206 may be slightly patterned or ridged which may facilitate adhesion of a mold compound to the sidewalls of the plurality of recesses 206. In various implementations, the plurality of recesses 206 may be positioned in the wafer 198 so that they are between the semiconductor devices in the wafer.

Referring to FIG. 18C, the method for forming the semiconductor package of FIG. 16 includes applying a mold compound 208 to the first side 196 of the wafer 208. The mold compound may include any type of mold compound disclosed herein and may be applied using, by non-limiting example, a liquid dispensing technique, a transfer molding technique, a vacuum molding technique, a glob top molding technique, or a compression molding technique. In various implementations, and as illustrated by FIG. 18C, the mold compound 208 may encapsulate the plurality of bumps 194 and fill the plurality of recesses 206. In other implementations, the mold compound 208 may only be applied within the plurality of recesses 206 and between the plurality of bumps 194 without flowing over the outer surfaces 210 of the plurality of bumps 194.

Referring to FIG. 18D, the method for forming the semiconductor package of FIG. 16 may include thinning a second side 212 of the wafer 198 to the desired depth of the plurality of recesses 206. In particular implementations, the method may include backgrinding a second side 212 of the wafer 198 to reach the plurality of recesses 206 and singulate a plurality of die 214 from the wafer. In implementations where the second side 212 of the wafer 198 is background, the backgrinding may use a process marketed under the trade name TAIKO by DISCO of Tokyo, Japan. The backgrinding leaves a ring of non-removed material (TAIKO ring) along the perimeter of the wafer which helps to prevent the wafer from curling, warping or otherwise bending during processing while at the same time removing most of the thickness and material of the second side 212, or backside of the wafer 198. The ring is then subsequently removed in a separate cutting step prior to singulation of the die. In other implementations of methods of forming semiconductor devices the TAIKO process may not be used, but some other backgrinding or other material-removal technique may be used, such as removing the material through a wet etch. In various implementations, the thinned wafer 198, or plurality of die 214, may be less than 50 um thick, while in other implementations the thinned wafer, or plurality of die, may be 50 or more um thick. The mold compound 208 coupled to the first side 196 of the wafer 198 and within the plurality of recesses 206 may facilitate thinning the wafer 198 by providing structural support to the wafer. In other implementations, the second side 212 of the wafer may not be thinned to the depth of the desired recesses 206. In this manner, the die of each semiconductor package may be stepped upon singulating the wafer 198.

Figure 18E:
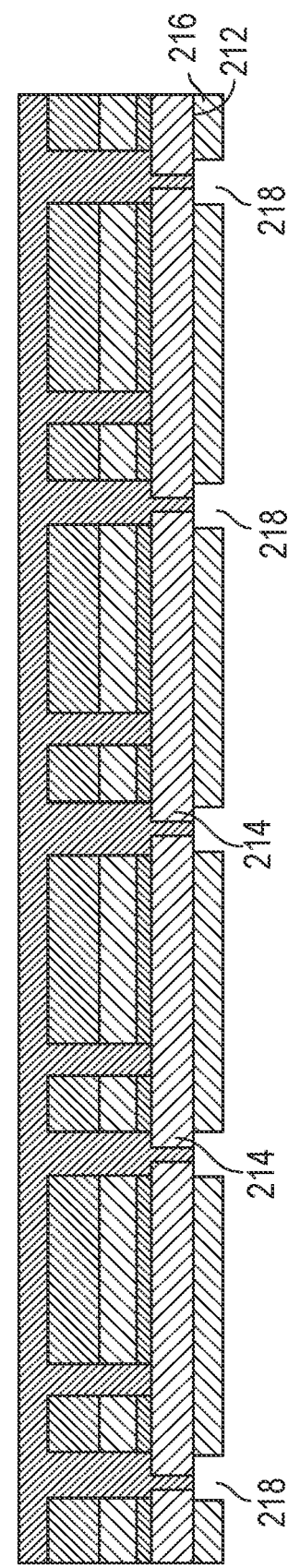

Referring to FIG. 18E, the method for forming the semiconductor package of FIG. 16 may include coupling a backside metal layer 216 to the second side 212 of the wafer 198 or to the second side of the plurality of die 214. The backside metal layer 216 may be any type of metal disclosed herein, and in particular implementations, may include copper. In various implementations, the backside metal layer may be coupled to the second side of the wafer through an electroplating process. In other implementations, the backside metal layer may be coupled to the second side of the wafer through a sputtering process or an electroplating process. In still other implementations, the backside metal layer may be a metal frame/film coupled to the wafer through, by non-limiting example, sintering, soldering, or fusion bonding. In various implementations, the backside metal layer 216 may be a thick backside metal layer and in particular implementations, may be as thick as or thicker than the thinned wafer 198. In various implementations, the method for forming the semiconductor package of FIG. 16 may include forming a plurality of openings 218 in the backside metal layer 216. In other implementations, the backside metal layer 216 may not include any openings therein. In implementations where a plurality of openings 218 are formed in the backside metal layer 216, the method may include, though not illustrated, applying a second mold compound to the second side 212 of the wafer 198 that fills the plurality of openings 218. The second mold compound may be the same as or different from the first mold compound 208. In various implementations, the second mold compound may also encapsulate the backside metal layer 216. In such implementations, the method may include backgrinding the second mold compound to expose the backside metal layer. In implementations with the second mold compound applied to the second side 212 of the wafer 198, the entirety of the die of the singulated semiconductor may be at least partially covered by a mold compound on all six sides of the die. In implementations where the second side 212 of the wafer 198 is background using the Taiko process, the Taiko ring may be removed after the backside metal is coupled to/formed on the second side of the wafer using a separate singulation process.

Figure 18F:
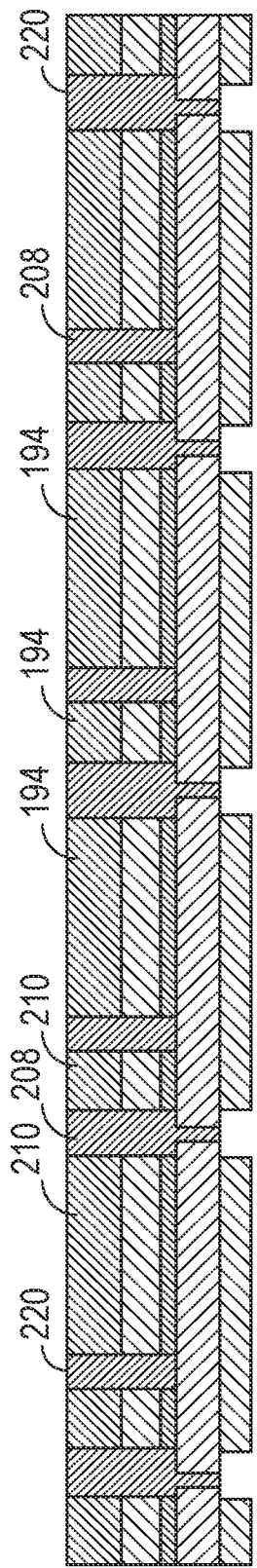

Referring to FIG. 18F, the method for forming the semiconductor package of FIG. 16 may include exposing the outer surface 210 of the plurality of bumps 194 through the mold compound 208 by grinding the mold compound 208. In various implementations, only the mold compound may be ground until it is coextensive with the surface 210, however, in other implementations the mold compound and a portion of the plurality of bumps 194 may be ground together. In this manner, the method may include planarizing the outer surface 210 of the plurality of bumps 194 with the outer surface 220 of the mold compound 208. The backmetal layer 216 may facilitate the thinning of the mold compound 208 by adding structural support to the wafer 198 and the plurality of die 214. In various implementations, and as illustrated by the order of FIGS. 18C-18F, the second side 212 of the wafer 198 may be thinned before the mold compound 208 is ground to expose the plurality of bumps 194, however, in other implementations the method may include grinding the mold compound 208 to expose the plurality of bumps before the second side 212 of the wafer 198 is thinned.

Figure 18G:
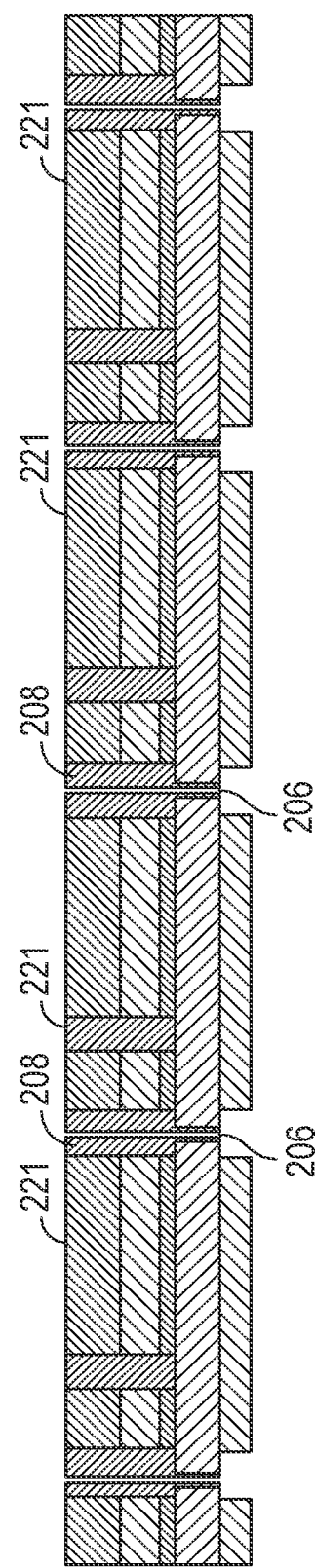

Referring to FIG. 18G, the method for forming the semiconductor package of FIG. 16 includes singulating the mold compound 208 through the plurality of recesses 206 into a plurality of semiconductor packages 221. The mold compound may be singulated using a saw, a laser, a plasma etch, water jet cutting, a chemical etch, or any other method for cutting or removing mold compound. In various implementations, the singulation line (or the width of the cut/etch made to singulate the mold compound) may be less wide as compared to the width of each recess of the plurality of recesses 206. In such implementations, the sidewalls of each die of the plurality of semiconductor packages may be covered by the mold compound 208. In implementations where the backside metal is not patterned, the backside metal may be singulated along with the mold compound to form the plurality of semiconductor packages.

Figure 19A:
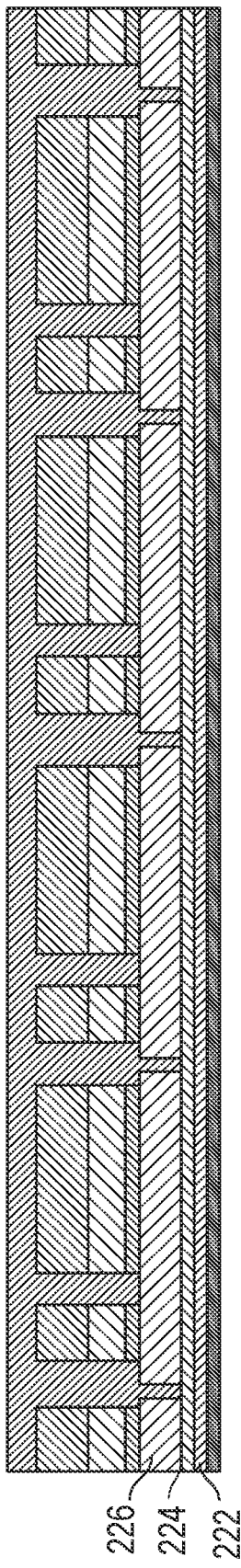
FIGS. 19A-19C are cross-section side views of a semiconductor device following various steps of a method for forming the semiconductor package of FIG. 17.
Figure 19B:
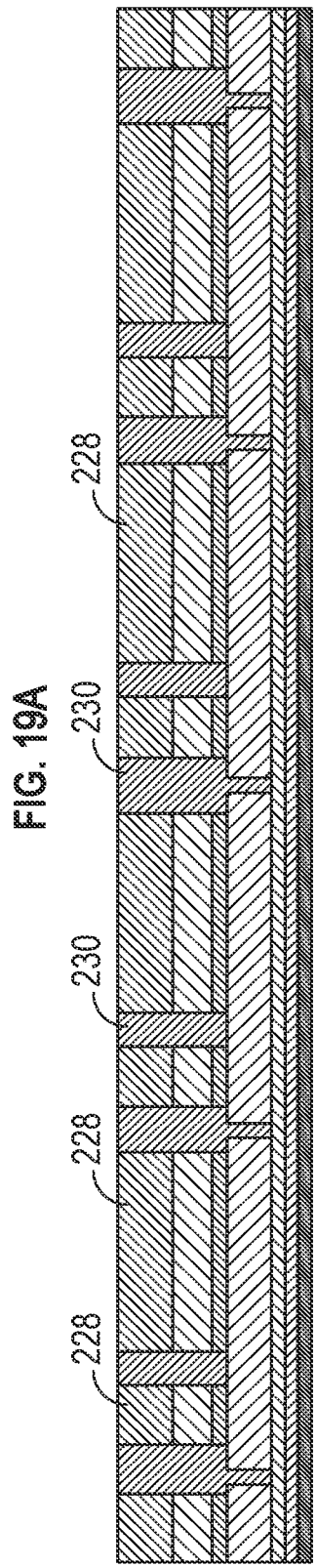
Figure 19C:
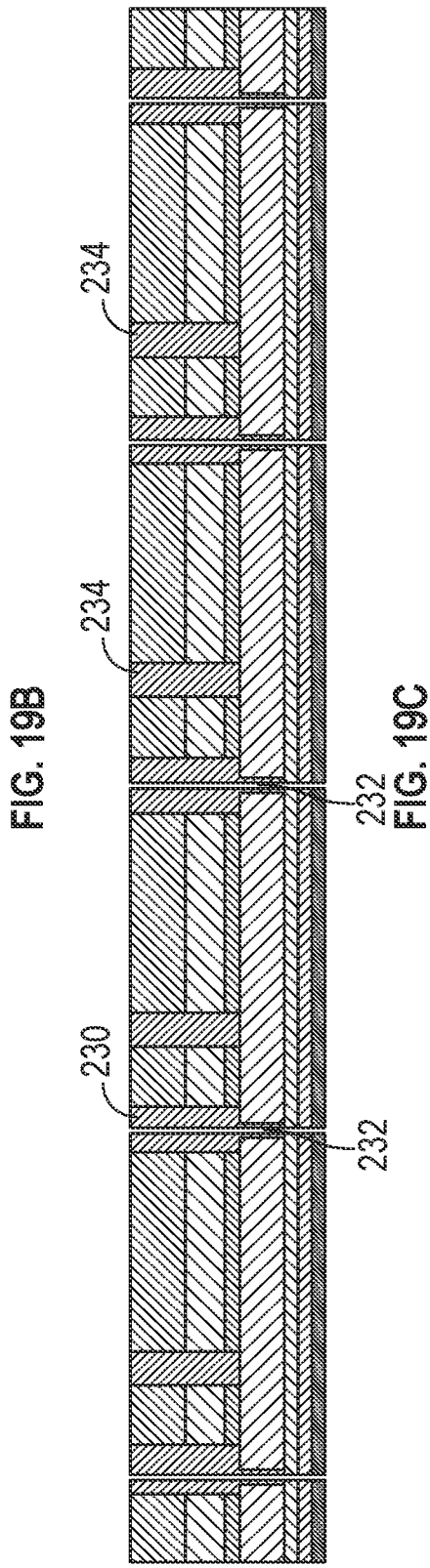

Referring to FIGS. 19A-19C, cross-section side views of a semiconductor device after steps of an implementation of a method for forming the semiconductor package of FIG. 17 are illustrated. Referring specifically to FIG. 19A, the method for forming the semiconductor package of FIG. 17 may be similar to the method illustrated in FIGS. 18A-18G, with the difference being that the method may include coupling a backside metal layer 222 to the second side 224 of the wafer 226 (or coupling a backside metal layer to a second side of the plurality of die), with the backside metal layer including multiple backside metal layers. In the implementation illustrated by FIG. 19A the method includes coupling a backside metal layer 222 which includes three different backside metal layers. In various implementations, the backside metal layer 222 may include more than or less than three backside metal layers. Each layer of the backside metal layer may be deposited to the wafer through, by non-limiting example, a sputtering or evaporation technique. In various implementations, the backside metal layer may include, by non-limiting example, titanium, nickel, silver, copper, vanadium, or any other metal. In particular implementations, the backside metal layer may include a titanium layer, a nickel layer, and a silver-copper layer. In other particular implementations, the backside metal layer may include a titanium layer, a nickel-vanadium layer, and a silver-copper layer. In various implementations, and as illustrated by FIG. 19A, the backside metal layer 222 may be patterned or may not be patterned.

Referring to FIG. 19B, the method for forming the semiconductor package of FIG. 17 may include exposing the plurality of bumps 228 through the mold compound 230 by grinding the mold compound. The plurality of bumps may be exposed using the same method or a similar method as described above in relation to FIG. 18F.

Referring to FIGS. 19A and 19C, the method for forming the semiconductor package of FIG. 17 includes singulating the mold compound 230 through the plurality of recesses 232 and the backside metal layer 222 into a plurality of semiconductor packages 234. The mold compound 230 and the backside metal layer 222 may be singulated using any method disclosed herein. As the backside metal layer is not patterned, the sidewalls of the backside metal layer may be coextensive with the sides of the respective semiconductor packages 234.

The methods for forming semiconductor packages disclosed herein may allow for the formation of thin die without needing a dual metallization process for the purpose of stress balance. The mold compound and the backside metal layer may offer the necessary support needed to handle the thinned die and wafer during formation of the semiconductor packages.

Figure 20:
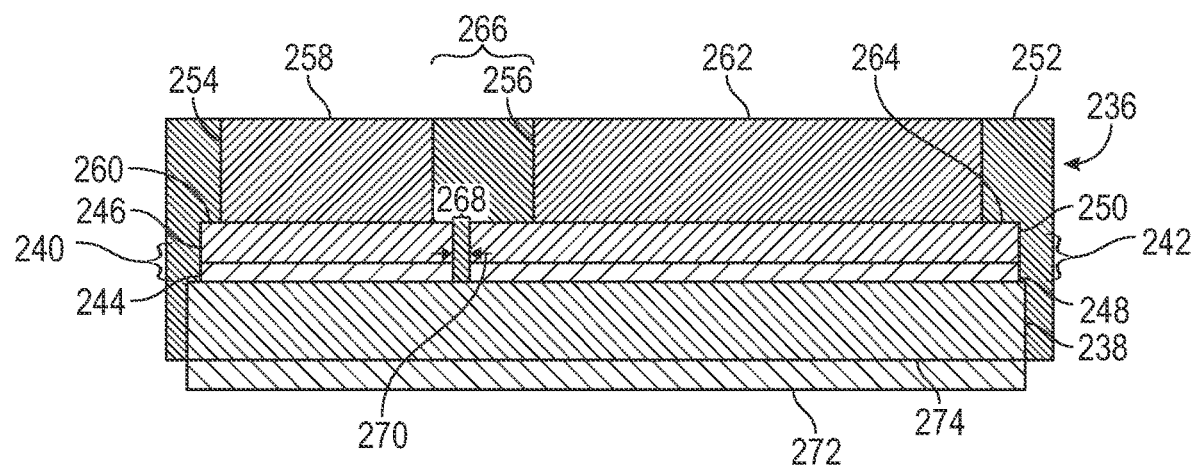
FIG. 20 is a cross-section side view of an implementation of a semiconductor package with two pad layers.

Referring to FIG. 20, an implementation of a semiconductor package 236 is illustrated which can be formed using thinned or thin semiconductor die (die) like those disclosed herein or with full thickness die. In various implementations, the die thickness may be between about 0.1 microns to about 125 microns. In the implementation illustrated in FIG. 20, the die 238 is thinned and includes first pad 240 and second pad 242 formed thereon. As illustrated, the first pad 240 includes a first layer 244 and a second layer 246 where the second layer 246 has a thickness greater than a thickness of the first layer 244. Similarly, the second pad 242 includes a first layer 248 and a second layer 250 where the second layer 250 has a thickness greater than a thickness of the first layer 248. In various implementations, the thickness of the combined first layer and second layer of both the first pad 240 and the second pad 242 may be between about 5 microns to about 20 microns. The particular total thickness of the pad may be determined by the desired efficiency for the package (electrical, thermal, etc.). The ability to have the thickness of the second layers 246, 250 thicker than the thickness of the first layers 244, 248 allows for minimization of the spacing between the first pad 240 and the second pad 242 because the resulting thicker pads allows for better flow of organic material between the pads. Minimization of the spacing between the first pad 240 and the second pad 242 permits maximization of the size of the source area of the device (size of the source pad) and so improves the electrical efficiency of the semiconductor device(s) in the die. Generally, the larger the source pad for various semiconductor devices, the better performance is possible.

In various pad layer implementations, the second layers can be, by non-limiting example, electroplated, electroless plated, sputtered, evaporated, screen printed, soldered, solder printed, sintered, or any other method of forming a metal-containing layer may be employed in various implementations. In various implementations, various passivation materials/layers may be located around or partially on first pad 240 and/or second pad 242, such as, by non-limiting example, polyimides, silicon nitrides, oxides, or any other passivating materials. Each of the first layers 244, 248 and the second layers 246, 250 may be formed of several layers, such as, by non-limiting example, a seed metal layer, a boundary layer, a diffusion barrier layer, or other layers in combination with a metal-containing layer that forms the bulk of the thickness of the layer. In various implementations, a perimeter of the second layers 246, 250 may be substantially the same size as a perimeter of the first layers 244, 248, but in other implementations the perimeter of the second layers 246, 250 may be smaller or larger.

In some implementations, the thicker second layer may not be used, and a single layer pad may couple directly with the conductors which have a smaller perimeter than the single layer pads.

In order to ensure that no shorting between the two pads occurs at a first (upper) surface 252 of the package, a first conductor 254 is coupled to the second layer 246 of the first pad 240. In the implementation illustrated in FIG. 20, the first conductor 254 is illustrated as being directly coupled to the second layer 246. As illustrated, a second conductor 256 is also coupled to the second layer 250 of the second pad 242. As illustrated, a perimeter 258 of the first conductor 254 is smaller than the perimeter 260 of the second layer 246 of the first pad 240. In various implementations, the perimeter 258 of the first conductor 254 is located entirely within the perimeter 260 of the second layer 246. Similarly, as illustrated, a perimeter 262 of the second conductor 256 is smaller than the perimeter 264 of the second layer 250 of the second pad 242. In various implementations, the perimeter 262 of the second conductor 256 is located entirely within the perimeter 264 of the second pad 242. Because the perimeter 258 of the first conductor 254 and the perimeter 262 of the second conductor 256 are smaller than the perimeters 260, 264 of the second layers 250, 246 of the first pad 240 and second pad 242, respectively, a space/spacing 266 between the first conductor 254 and the second conductor 256 is larger than a spacing 268 between the first pad 240 and second pad 242. Referring to FIG. 24, an implementation of a package 352 is illustrated where the perimeter 354 of a first conductor 356 is entirely within perimeter 358 of the second layer 360 of a first pad and likewise where the perimeter 362 of a second conductor 364 is entirely with the perimeter 366 of the second layer 368 of a second pad. In various implementations, the spacing 266 may be larger than the spacing 270 between the second layer 246 and second layer 250 of the first pad 240 and second pad 242, respectively.

The difference in the size of the spacing 266 relative to the spacings 268 and 270 prevents shorting between the first conductor 254 and the second conductor 256 during operation of the device while allowing for maximization of the size of the second pad 242. Where the first pad 240 is a gate pad of a semiconductor device and the second pad 242 is a source pad, maximizing the size of the second pad 242 maximizes the size of the source pad, which may lead to more efficient operation of the semiconductor device. Also, the difference in the size of the spacings enables sufficient flow of organic material 252 into the space between the first pad 240 and the second pad 242 while also ensuring sufficient organic material 252 is present between the first conductor 254 and the second conductor 256 to prevent shorting during operation. Where the semiconductor package is being attached using a flip chip process, the wider spacing 266 can also ensure that solder used to bond the first conductor 254 of a gate pad during assembly will not short to solder used to bond the second conductor 256 of a source pad.

As illustrated, in various implementations of the semiconductor package 236, a backmetal 272 may be included on a second side 274 of the die 238. The backmetal 272 may be formed of any material disclosed herein and may be a single layer or multiple layers of backmetal materials. In other implementations, however, no backmetal layer may be included.

The material used in various implementations for the first layers 244 and 248 may be, by non-limiting example, Al, AlCu, AlCuSi, AlSi, Cu, Ti, multiple layers of any of the previous metals, alloys of the previous metals, or any other metal. Similarly, the materials used in various implementations for the second layers 246, 250 may be, by non-limiting example, Al, AlCu, AlCuSi, AlSi, Cu, Ti, multiple layers of any of the previous metals, alloys of the previous metals, or any other metal. In various implementations, the materials of the first layers 244, 248 may be the same materials as those used in the second layers 246, 250. In various semiconductor package and method implementations disclosed in this document, any of the pads or electrical connectors disclosed in this document may be formed, by any or any combination of the following: evaporation, sputtering, soldering together, screen printing, solder screen printing, silver sintering one or more layers of materials. Any of the foregoing may also be used in combination with electroplating or electroless plating methods of forming pads and/or electrical connectors.

In various implementations, the organic material may be, by non-limiting example, a mold compound, an epoxy, a resin, a polyimide, a polymer, an encapsulant, or any other carbon-containing material. The organic material may also include a wide variety of additives, including, by non-limiting example, fillers, pigments, particles, thermal transfer aids, or any other additive type used for a mold compound or encapsulant.

Various implementations of method of forming semiconductor packages can be used to form semiconductor packages with structures similar to those illustrated in FIG. 20. In these method implementations, no precut or partial grooving between the plurality of die of a semiconductor substrate (or groups of die) may be carried out. Where the plurality of die (or groups of die) will be thinned, the depth of the die/saw streets/scribe lines may be sufficient to carry out the various methods of forming semiconductor packages disclosed herein. For example, and with reference to FIGS. 22A and 22F, where the semiconductor substrate 276 will be thinned to about 10 microns, the about 5 micron depth of the die streets 278 into the material of the substrate/die resulting from the processing steps that form the groups of semiconductor die suffices to act as the equivalent of any partial grooving/precutting.

In particular method implementations, the depth of the die streets 278 can be increased during the die fabrication process. In other particular method implementations, the depth of the die streets may be increased during die preparation/packaging processes following die fabrication. In this way, any separate precut or partial grooving of the wafer using a saw or other process may be rendered unnecessary. Avoiding separately precutting/partial grooving may facilitate the sawing process and/or eliminate risk of sidewall cracking due to coefficient of thermal expansion (CTE) mismatches. While using the depth of the die streets 278 to set sidewall coverage of organic material rather than the depth of a precut into the semiconductor substrate may reduce the partial sidewall coverage for each group of die, the benefits may outweigh the additional coverage in various method implementations.

Figure 22D:
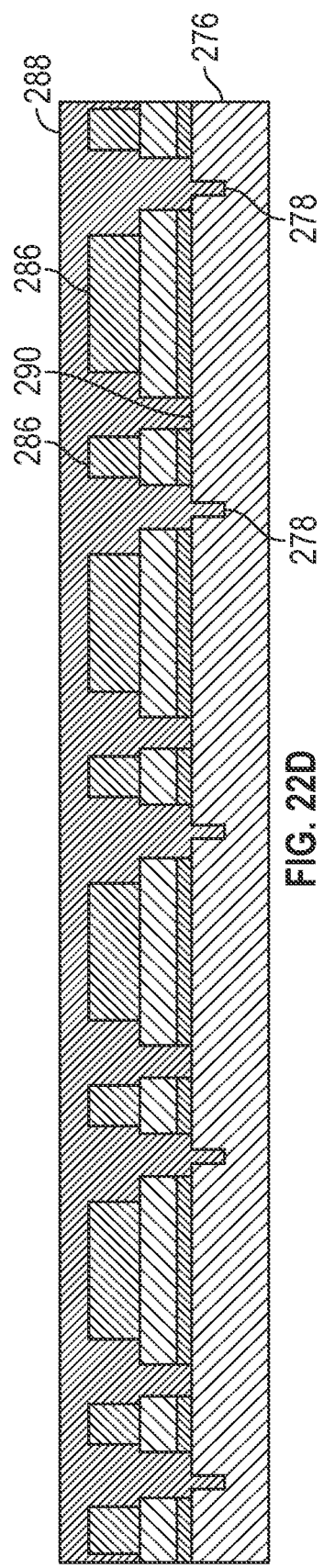
Figure 22E:
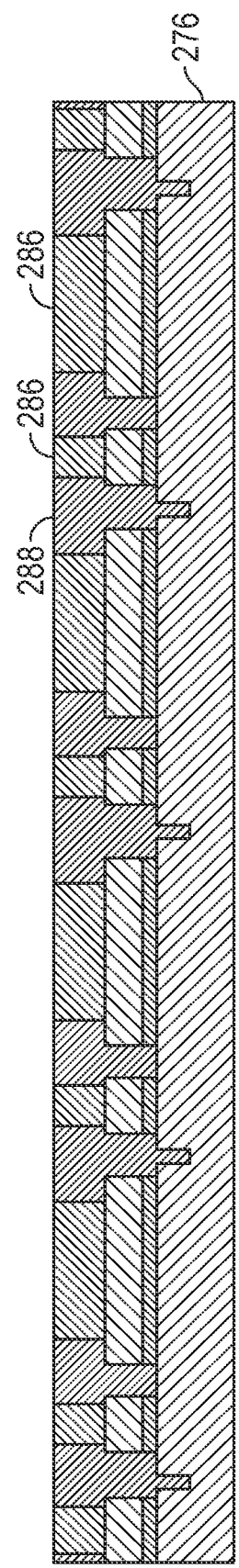
Figure 22F:
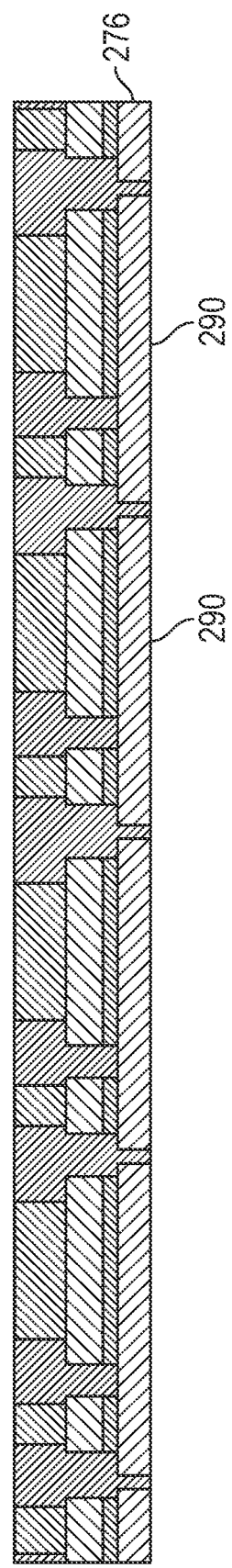

Referring to FIG. 22A, first layers 280 of the die pads of the plurality of semiconductor die in the semiconductor substrate 276 are illustrated after being formed on the material of the substrate 276. The first layers 280 may be formed using any method of depositing an electrical contact disclosed herein. Referring to FIG. 22B, the semiconductor substrate 276 is illustrated following formation of second layers 282 over the first layers 280 using any method of depositing an electrical contact disclosed herein. As illustrated, the thickness 284 of the second layers 282 is thicker than that of the first layers 280. FIG. 22C illustrates the substrate 276 after formation of conductors 286 over the second layers 282. While a single conductor per pad is illustrated as being formed in the implementation illustrated in FIG. 22C, in other implementations, more than one conductor could be formed/used per pad. Referring to FIG. 22D, the substrate 276 is illustrated after application of an organic material 288 to the first side 290 of the semiconductor substrate 276. As illustrated, the organic material 288 fills the die streets 278 and the spaces between the pads and the conductors 286. FIG. 22E illustrates the semiconductor substrate 276 following leveling of the organic material 288 to the upper surface of the conductors 286. The leveling process may be, by non-limiting example, grinding, polishing, laser ablating, etching, or any other process for removing organic material. Referring to FIG. 22F, the semiconductor substrate 276 is illustrated following thinning of the substrate 276 material to the depth of the die streets 278, which results in singulating the various plurality of semiconductor die 290 from each other. The thinning process may be, by non-limiting example, backgrinding, polishing, lapping, or any process for removing a semiconductor material. While in the method implementation illustrated in FIGS. 22E and 22F the process of leveling the organic material 288 is carried out prior to thinning the semiconductor substrate 276, in other implementations, the order may be reversed, and the thinning carried out prior to leveling.

Referring to FIG. 22G, the substrate 276 is illustrated prior to singulation, which takes place through the organic material 288 between the various semiconductor die 290. In this implementation, singulation is being done using sawing, but in other implementations, any other method of singulation disclosed in this document may be used, including, by non-limiting example, laser ablating, etching, plasma etching, water jet cutting, and any other method of singulation. FIG. 22H illustrates a plurality of semiconductor packages 292 that illustrate how, in various implementations, a backmetal layer (backmetal) 294 may be applied to the semiconductor die prior to singulation. The backmetal may be any disclosed herein and may be applied used any method disclosed herein. In various implementations, the backmetal may be patterned.

Figure 21:
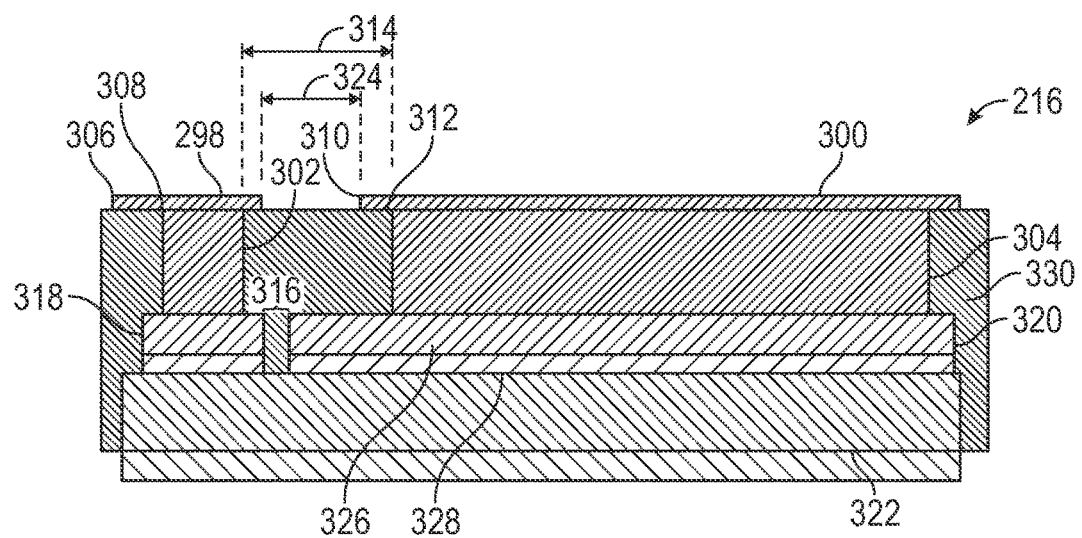
FIG. 21 is a cross-section side view of an implementation of a semiconductor package with first and second contact layers.

Referring to FIG. 21, another implementation of a semiconductor package 296 is illustrated in side cross-sectional view. As illustrated, this package 296 includes similar structures to that illustrated in FIG. 20 but differs principally in that first contact layer 298 and second contact layer 300 are formed over first conductor 302 and second conductor 304, respectively. The perimeter 306 of the first contact layer 298 is larger than the perimeter 308 of the first conductor 302 as is the perimeter 310 of the second contact layer 300 larger than the perimeter 312 of the second conductor 304. In various implementations, the perimeter 308 of the first conductor 302 may fit entirely within the perimeter 306 of the first contact layer 298 as may the perimeter 312 of the second conductor 304 fit entirely within the perimeter 310 of the second contact layer 300. The result of the use of the first contact layer 298 and the second contact layer 300 is that a spacing 314 between the first conductor 302 and the second conductor 304 may be wider than the spacing 266 in the package 236 implementation illustrated in FIG. 20. As illustrated in FIG. 21, this allows the spacing 316 between the first pad 318 and second pad 320 to be substantially the same as spacing 268 in the semiconductor package 236 illustrated in FIG. 20 while allowing the size of the second pad 320 to be larger than the size of the second pad 242. As a result, the efficiency of the semiconductor device(s) in the die 322 may be increased. Where the first pad 318 is a gate pad and the second pad 320 is a source pad, this particular package 296 implementation may have a higher efficiency than the package implementation 236 for the same die size.

The first contact layer 298 and second contact layer 300 are used to provided bondable/solderable electrical contacts and can be oriented above the first conductor 302 and second conductor 306 to allow for the bonding regions to be spaced apart with spacing 324 sufficient to prevent shorting during flip chip or other bonding operations. As illustrated, the use of a thicker second layer 326 than a first layer 328 facilitates narrowing the spacing 316 between the first pad 318 and second pad 320 similar to the package implementation illustrated in FIG. 20. Any of the materials for the first layer 328 and second layer 326 previously disclosed with respect to the package 236 may be utilized herein. Organic material 330 is illustrated as being used to fill the spacings between the various components and may be any organic material disclosed in this document with any additional material included therein.

In various pad layer implementations, the second layers can be, by non-limiting example, electroplated, electroless plated, sputtered, evaporated, screen printed, soldered, solder printed, sintered, or any other method of forming a metal-containing layer may be employed in various implementations. In various implementations, various passivation materials/layers may be located around or partially on first pad 318 and/or second pad 320, such as, by non-limiting example, polyimides, silicon nitrides, oxides, or any other passivating materials. Each of the first layers and the second layers may be formed of several layers, such as, by non-limiting example, a seed metal layer, a boundary layer, a diffusion barrier layer, or other layers in combination with a metal-containing layer that forms the bulk of the thickness of the layer. In various implementations, a perimeter of the second layers may be substantially the same size as a perimeter of the first layers, but in other implementations the perimeter of the second layers may be smaller or larger.

Figure 23A:
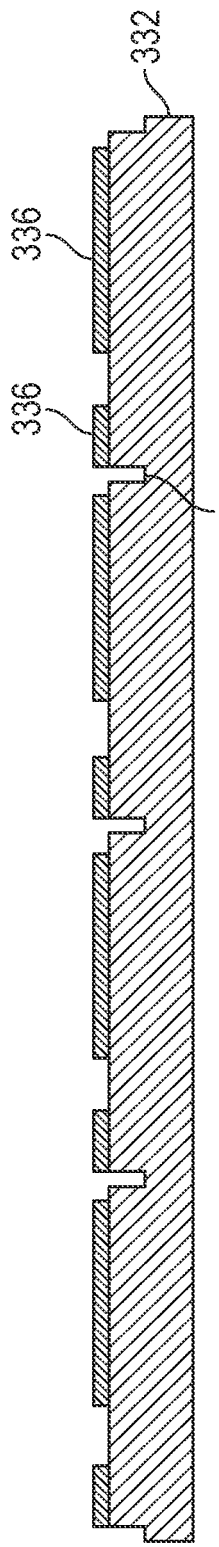
FIGS. 23A-I are cross-section side views of an implementation of a semiconductor substrate following various steps of a method of forming the semiconductor package of FIG. 21.
Figure 23B:
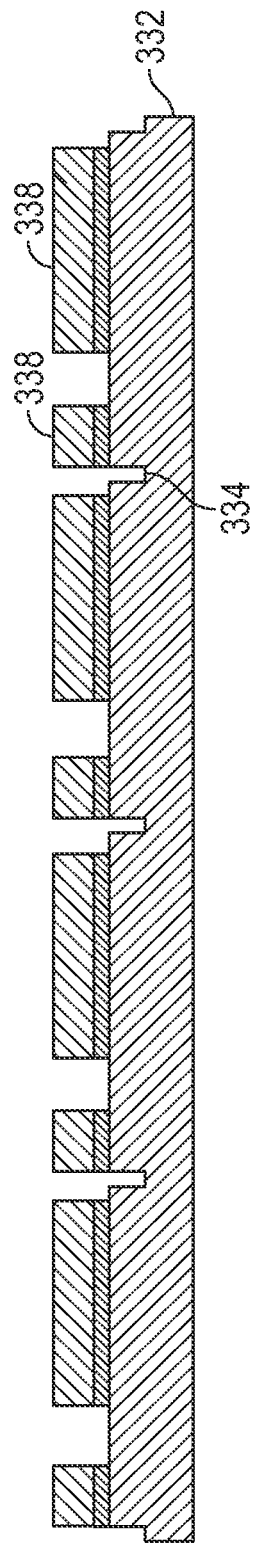
Figure 23C:
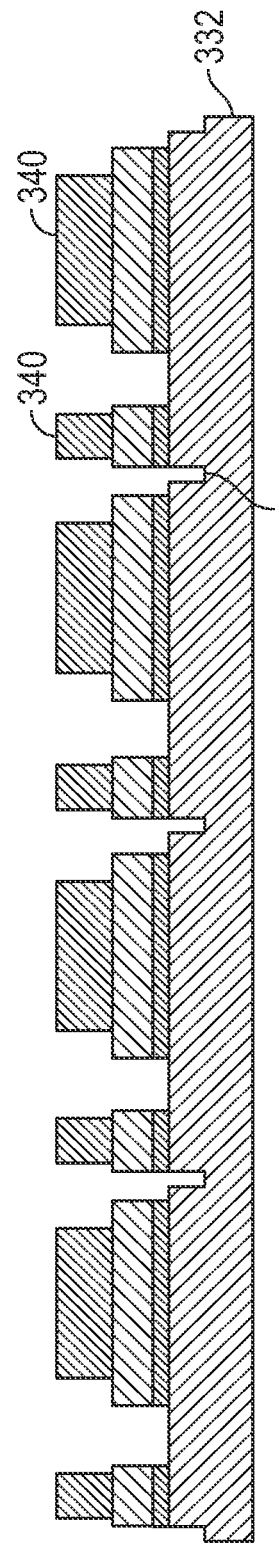
Figure 23D:
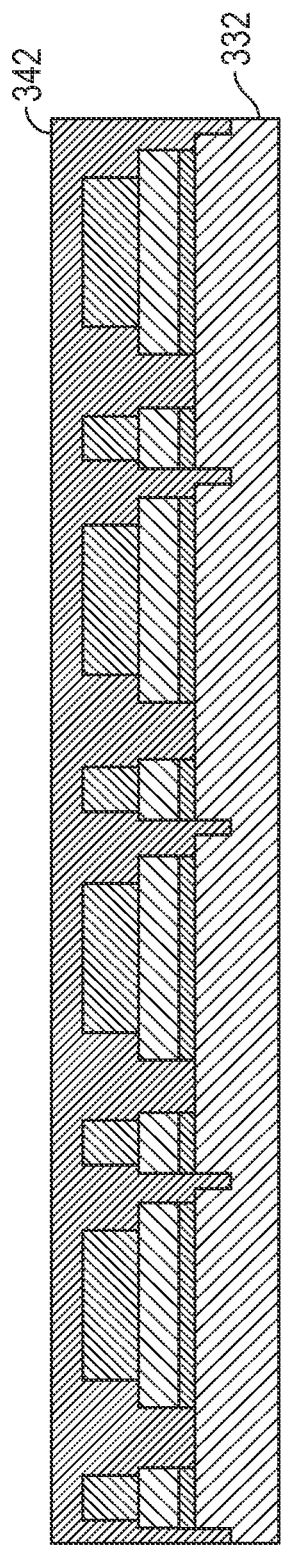
Figure 23E:
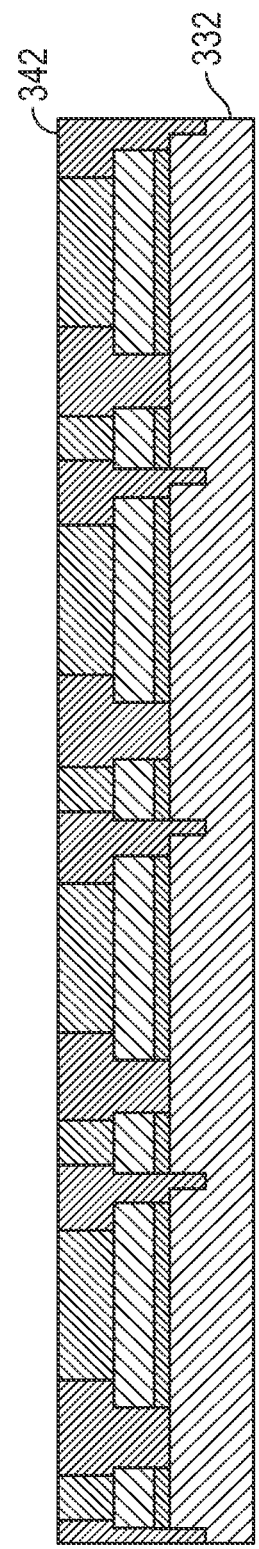
Figure 23F:
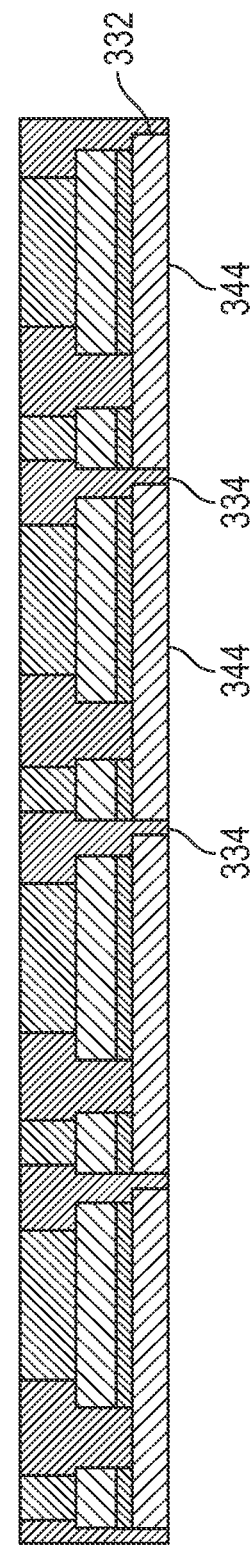
Figure 23G:
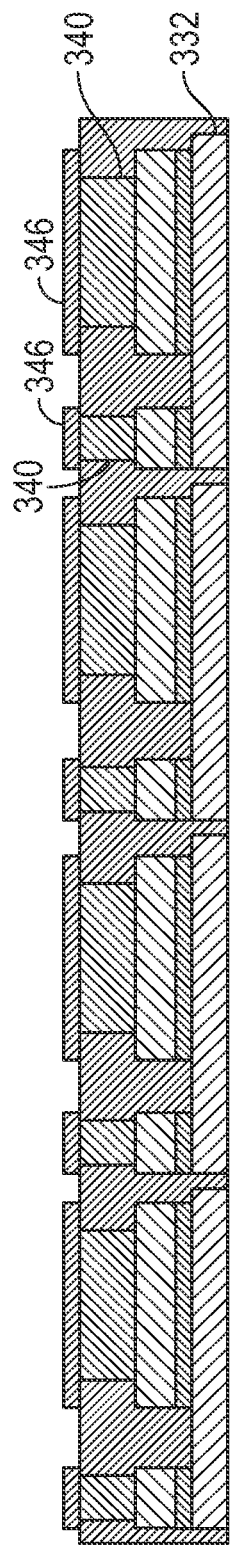

FIGS. 23A-I illustrate a semiconductor substrate 332 at various points after various steps of an implementation of a method of forming a semiconductor package. Many of the process steps are similar to the method illustrates in FIGS. 23A-H. As previously discussed, no grooving may be carried out in the die streets 334 in various method implementations as the depth of the die streets 334 may be sufficient. In other method implementations, deepening of the die streets 334 or forming of additional grooves may be employed in various implementations. FIGS. 23A-C illustrate the semiconductor substrate 332 following formation of the first layer 336 of the die pads, second layer 338 of the die pads, and the conductors 340. Any of the disclosed methods in this document for forming the various layers and conductors may be employed in various implementations. FIGS. 23D-F illustrate the semiconductor substrate 332 following application of organic material 342, leveling of the organic material 342, and thinning of the substrate 332 to singulate the various die 344 at the die streets 334. FIG. 23G illustrates the substrate 332 following formation of the contact layers 346 coupled over the conductors 340. In various implementations, the contact layers 346 may be formed using any method disclosed in this document for forming a layer of metallic material. The material of the contact layers 346 may be any material disclosed herein for pad layers, or may be a solder or screen printed metal-containing material in particular implementations. While in the method implementation illustrated, the contact layers 346 are formed following thinning of the substrate 332, in other implementations, backgrinding may be carried out following application of the contact layers 346 or following leveling of the organic material 342.

Figure 23H:
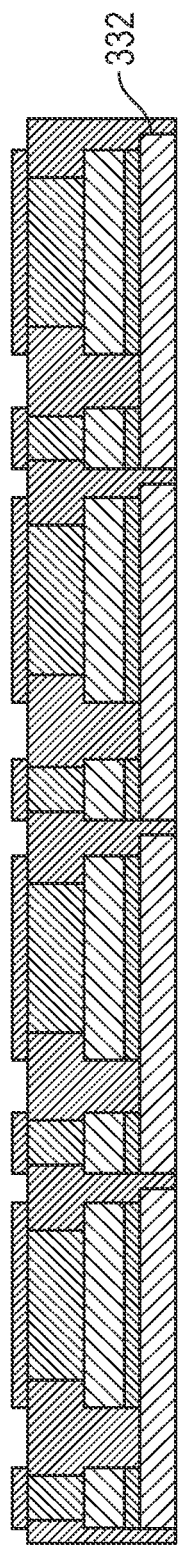
Figure 23I:
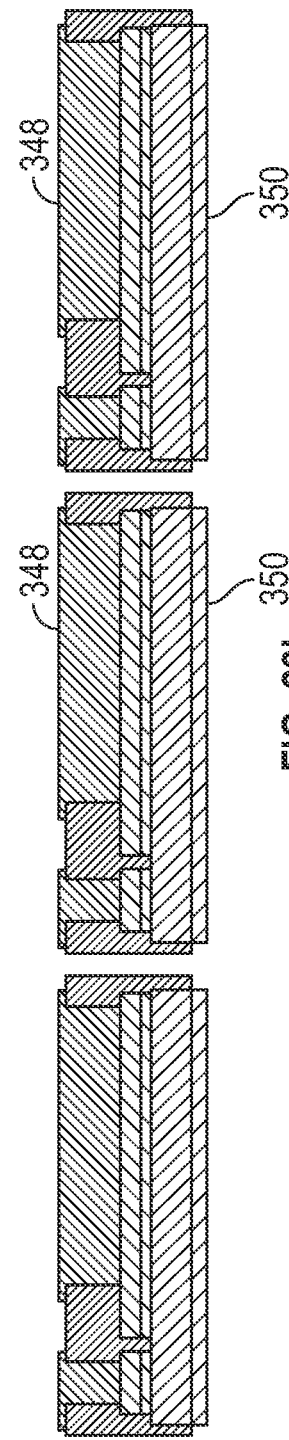

FIG. 23H illustrates the substrate 332 just prior to singulation using sawing, though any singulation method disclosed herein may be utilized in various implementations. FIG. 23I illustrates a plurality of semiconductor packages 348 that include backmetal 350, indicating that a backmetal formation process may be employed prior to singulation in various method implementations. Any of the backmetal types and material types may be utilized in various method implementations. In various method implementations, prior to application of backmetal a stress relief wet etching process may be carried out. In various implementations, the stress relief wet etching may be carried out with or without the backmetal layer applied. In some implementations, the stress relief wet etching may take place after protecting the front side (die side) of the semiconductor substrate. The stress relief etching may reduce the backside damage to the semiconductor substrate that is caused by the backgrinding process. The use of the stress relief etching may also facilitate adhesion of the backmetal applied to the ground surface. In various implementations, the application of the contact layers may be carried out prior to or after a backmetal formation process. A wide variety of sequences of method steps involving coupling of the contact layers may be carried out using the principles disclosed in this document for packaging process involving wafer scale operations like those disclosed in this document used for semiconductor substrates.

In various implementations, the structure of the contact layers mushrooms over the material of the organic material. The effect of having the wider contact layers allows for a larger bonding area than the bonding area of the conductors themselves, permitting the conductors to be made smaller thereby allow for greater maximization of the source pad size in various implementations. In some implementations, the thicker second layer may not be used, and a single layer pad may couple directly with the conductors which have a smaller perimeter than the single layer pads.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:
1. A semiconductor package, comprising:
a die comprising a first side and a second side;
a first pad and a second pad each coupled to the first side of the die, the first pad and the second pad each comprising a first layer and a second layer where the second layer is thicker than the first layer;
at least a first conductor directly coupled to the second layer of the first pad, the at least one first conductor having a perimeter entirely within a perimeter of the second layer of the first pad;
at least a second conductor directly coupled to the second layer of the second pad, the at least one second conductor having a perimeter entirely within a perimeter of the second layer of the second pad; and
a single layer of organic material covering at least a portion of at least the first side of the die, wherein the at least first conductor and the at least second conductor extend through corresponding openings in the single layer of organic material;

wherein a spacing between the at least first conductor and the at least second conductor is wider than a spacing between the second layer of the first pad and the second layer of the second pad and each spacing is filled by the single layer of organic material.

2. The package of claim 1, wherein the first pad is a gate pad and the second pad is a source pad.

3. The package of claim 1, wherein the perimeter of the second layer of the second pad is larger than the perimeter of the second layer of the first pad.

4. The package of claim 1, further comprising a backmetal coupled to the second side of the semiconductor die.

5. The package of claim 1, wherein the die has a thickness of 0.1 micron to 125 microns.

6. The package of claim 1, wherein a material of the second layer is one of the same material or a different material from the material of the first layer.

7. The package of claim 1, wherein the organic material is a mold compound.

8. The package of claim 1, further comprising a first contact layer coupled directly over the at least first conductor and a second contact layer coupled directly over the at least second contact layer.

9. The package of claim 8, wherein a perimeter of the first contact layer is larger than the perimeter of the at least first conductor and a perimeter of the second contact layer is larger than the perimeter of the at least second conductor.

10. A semiconductor package, comprising:
a die comprising a first side and a second side;
a first pad and a second pad each coupled to the first side of the die, the first pad and the second pad each comprising a first layer and a second layer where the second layer is thicker than the first layer;
at least a first conductor directly coupled to the second layer of the first pad;
at least a second conductor directly coupled to the second layer of the second pad;
a first contact layer coupled directly over the at least first conductor and a second contact layer coupled directly over the at least second conductor; and
a single layer of organic material surrounding the at least first conductor and the at least second conductor;
wherein a spacing between the first contact layer and the second contact layer is wider than a spacing between the second layer of the first pad and the second layer of the second pad and each spacing is filled with the single layer of organic material.

11. The package of claim 10, wherein the first pad is a gate pad and the second pad is a source pad.

12. The package of claim 10, wherein a perimeter of the second layer of the second pad is larger than a perimeter of the second layer of the first pad.

13. The package of claim 10, further comprising a backmetal coupled to the second side of the semiconductor die.

14. The package of claim 10, wherein the die has a thickness of 0.1 micron to 125 microns.

15. The package of claim 10, wherein a material of the second layer is one of the same material or a different material from the material of the first layer.

16. The package of claim 10, wherein the organic material is a mold compound.

* * * * *